(12) United States Patent
Slik

(10) Patent No.: US 9,430,321 B2
(45) Date of Patent: Aug. 30, 2016

(54) RECONSTRUCTING DATA STORED ACROSS ARCHIVAL DATA STORAGE DEVICES

(71) Applicant: NetApp, Inc., Sunnyvale, CA (US)

(72) Inventor: David Slik, Burnaby (CA)

(73) Assignee: NetApp, Inc., Sunnyvale, CA (US)

( * ) Notice: Subject to any disclaimer, the term of this patent is extended or adjusted under 35 U.S.C. 154(b) by 106 days.

(21) Appl. No.: 14/276,676

(22) Filed: May 13, 2014

(65) Prior Publication Data
US 2015/0331744 A1 Nov. 19, 2015

(51) Int. Cl.
G11C 29/00 (2006.01)
G06F 11/10 (2006.01)
H03M 13/37 (2006.01)
H04L 29/08 (2006.01)

(52) U.S. Cl.
CPC .......... *G06F 11/10* (2013.01); *G06F 11/1076* (2013.01); *H03M 13/37* (2013.01); *H03M 13/373* (2013.01); *H04L 29/08* (2013.01); *H04L 67/1097* (2013.01)

(58) Field of Classification Search
CPC ............ G06F 11/1076; H03M 13/373; H04L 67/1097
See application file for complete search history.

(56) References Cited

U.S. PATENT DOCUMENTS

| | | | |
|---|---|---|---|
| 6,460,151 B1 | 10/2002 | Warwick et al. | |
| 7,191,283 B2 | 3/2007 | Amemiya et al. | |
| 7,380,088 B2 | 5/2008 | Wang et al. | |
| 7,917,810 B2 | 3/2011 | Piszczek et al. | |
| 8,244,974 B2 | 8/2012 | Keohane et al. | |
| 8,738,724 B2 | 5/2014 | Bernstein et al. | |
| 8,751,463 B1 | 6/2014 | Chamness | |
| 8,949,863 B1 | 2/2015 | Coatney et al. | |
| 9,047,017 B1 | 6/2015 | Dolan et al. | |
| 2005/0216523 A1 | 9/2005 | Sakaguchi et al. | |
| 2006/0253674 A1 | 11/2006 | Zohar et al. | |
| 2007/0260609 A1 | 11/2007 | Tulyani | |
| 2008/0034156 A1 | 2/2008 | Kawaguchi et al. | |
| 2008/0126357 A1 | 5/2008 | Casanova et al. | |
| 2008/0313241 A1 | 12/2008 | Li et al. | |
| 2009/0063883 A1 | 3/2009 | Mori | |
| 2010/0138702 A1 | 6/2010 | Mamata | |
| 2010/0281077 A1 | 11/2010 | Lillibridge et al. | |

(Continued)

FOREIGN PATENT DOCUMENTS

| | | |
|---|---|---|
| WO | 2007014296 A2 | 2/2007 |
| WO | 2014025820 A2 | 2/2014 |
| WO | 2014025821 A2 | 2/2014 |

OTHER PUBLICATIONS

International Search Report and Written Opinion for Application No. PCT/US2015/030663 mailed on Oct. 28, 2015, 41 pages.

*Primary Examiner* — Bryce Bonzo
*Assistant Examiner* — Thien D Nguyen
(74) *Attorney, Agent, or Firm* — Gilliam IP PLLC

(57) ABSTRACT

Techniques for operating a storage system are disclosed. A read request with an object identifier for a data object is received. A synchronous group of data storage devices across a plurality of enclosures is identified. The synchronous group is associated with the object identifier. A request is sent to the plurality of enclosures to synchronously activate the data storage devices in the synchronous group. After sending the request, data fragments associated with the object identifier are retrieved from the synchronous group of data storage devices. The data fragments are erasure decoded into a contiguous data range to reconstruct the data object.

19 Claims, 14 Drawing Sheets

(56) References Cited

U.S. PATENT DOCUMENTS

| | | |
|---|---|---|
| 2010/0313044 A1 | 12/2010 | Rajpal et al. |
| 2011/0231625 A1 | 9/2011 | Shalev et al. |
| 2012/0023292 A1 | 1/2012 | Saito et al. |
| 2013/0013652 A1 | 1/2013 | Gupta et al. |
| 2013/0132767 A1 | 5/2013 | Ninose |
| 2013/0318052 A1 | 11/2013 | Amit et al. |
| 2014/0122441 A1* | 5/2014 | Vervaet ............... G06F 11/1076 707/687 |
| 2014/0201576 A1 | 7/2014 | Wu et al. |
| 2014/0293765 A1 | 10/2014 | Gokita |
| 2014/0298061 A1* | 10/2014 | Volvovski ............ G06F 3/0625 713/323 |

* cited by examiner

RECONSTRUCTING DATA STORED ACROSS ARCHIVAL DATA STORAGE DEVICES

RELATED FIELD

This disclosure relates generally to a data storage system (also, "storage system"), and in particular to archival storage systems for infrequently accessed data.

BACKGROUND

Commercial enterprises (e.g., companies) and others gather, store, and analyze an increasing amount of data. The trend now is to store and archive almost all data before making a decision on whether or not to analyze the stored data. Although the per unit costs associated with storing data has declined over time, the total costs for storage has increased for many companies because of the volumes of stored data. Hence, it is important for companies to find cost-effective ways to manage their data storage environments for storing and managing large quantities of data. Companies now manage these costs by having various tiers of storage, with different costs associated with each of these tiers. Each tier can have different data storage hardware (e.g., storage processor, storage medium, storage I/O network, etc.) and different storage services (e.g., data maintenance, data integrity check, backup point-in-time images, etc.). Companies can use the different tiers of storage for different types of data. As an example, to store data that is accessed frequently, companies may use a data storage tier that has high performance characteristics. On the other hand, for big data applications, companies often prefer high density and/or high storage volume archival storage systems, which tend to be less expensive on a per unit basis. However, it is often a challenge to keep the cost down for these archival storage systems due to the necessity of maintaining a large number of data storage devices. To drive the cost of archival storage systems down while maintaining high storage density, conventional solutions tend to sacrifice computing capabilities, e.g., by removing storage efficiency services and/or reducing storage access bandwidth.

Figure 1A:
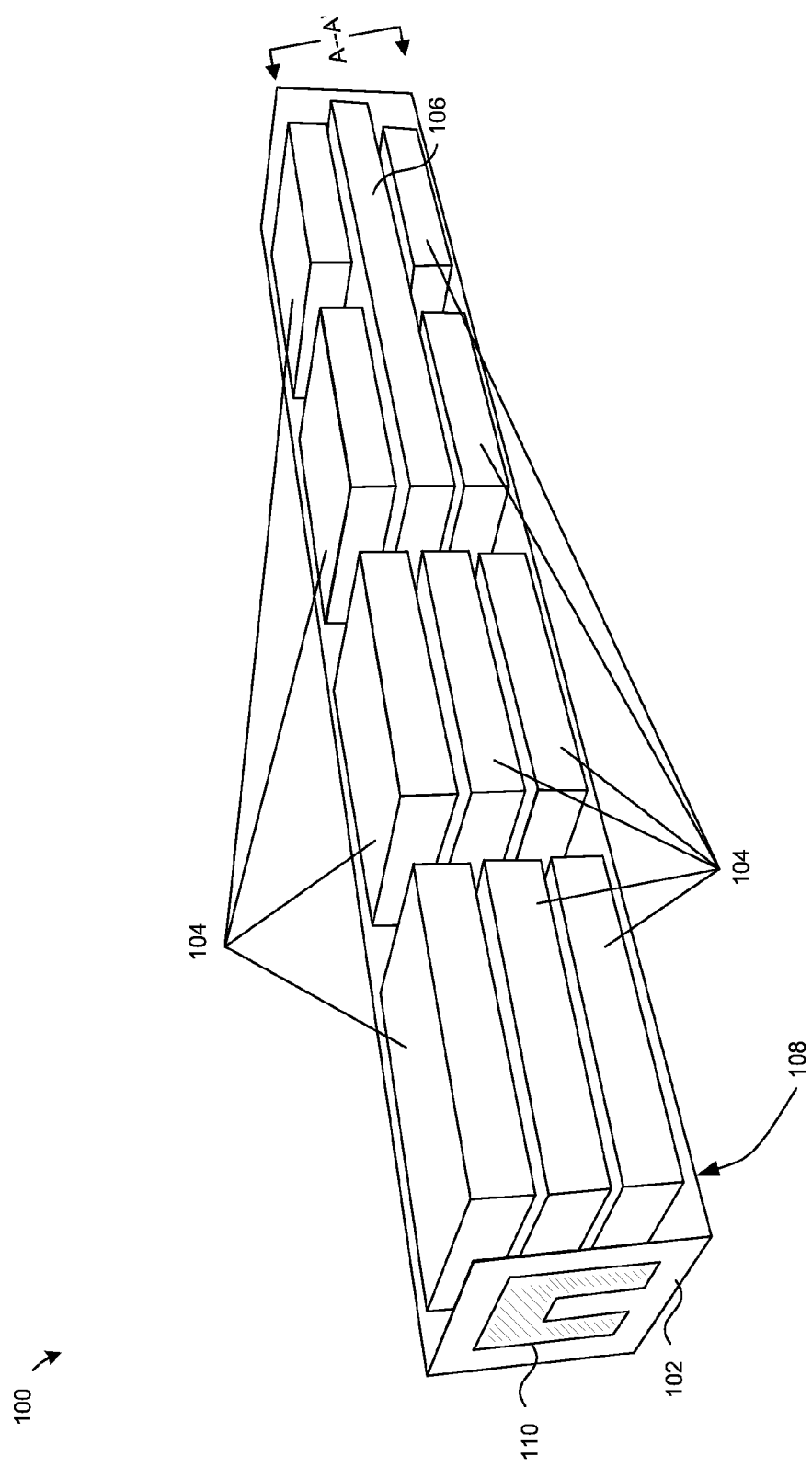
FIG. 1A is a perspective plan view of a multiple-data-storage-devices cartridge and components therein, consistent with various embodiments.

The figures depict various embodiments of the disclosure for purposes of illustration only. One skilled in the art will readily recognize from the following discussion that alternative embodiments of the structures and methods illustrated herein may be employed without departing from the principles of the disclosure described herein.

DETAILED DESCRIPTION

Disclosed are embodiments of an archival data storage system implemented by multiple-data-storage-devices cartridges. Each multiple-data-storage-devices cartridge ("cartridge") is an enclosure of two or more data storage devices (e.g., hard disk drives, solid state drives, hybrid drives, etc.), in which a subset of the data storage devices (e.g., a single data storage device) can be supplied power and accessed at a time. Presently, hard disk drives offer low per-unit costs, but it is possible that other types of data storage devices may eventually be cheaper than hard disk drives. The archival storage system is designed to store data that is rarely accessed ("cold" data). To save cost, the data storage devices used inside the cartridges are storage devices that may have a limited lifetime. For example, each data storage device in a cartridge may be designed to read data more frequently than to write data. In some embodiments, data are only be permitted to be written on each data storage devices once. In some embodiments, at least some of the data storage devices may be designed to fail after an average of around ten or so read end-to-end read accesses. The reduced lifetime is designed by using lower quality components, e.g., read heads as compared to the write heads in the data storage devices. Lower-quality components generally lead to lower costs, so when used appropriately, they can lower the total solution cost.

The data storage devices can be other types of low-cost, archival-class disk drives or other high-density data storage devices. The archival storage system is designed for cold data that is generally written only once to a data storage device and read back a few times, but not frequently. In some embodiments, one can estimate the limited lifetime of a data storage device by the number of write operations and the number of read operations (e.g., estimating based on a total number of operations or estimating based on the maximum of either the number of write operations or the number of read operations).

The archival storage system implements a data range application programming interface (API), e.g., through a number of data range processor modules. A data range processor module is a run-time service provided by one or more cartridges via an executable program implemented by a data processing component (e.g., a low power processor) of the cartridge. In some embodiments, the low-power processor may be an ARM-type processor or other processor generally deployed in presently commercialized cellular telephones and/or other low-power mobile computing devices. The data range APIs enable the archival storage system to scale in capacity, e.g., by adding more data storage devices per cartridge, and in both capacity and data throughput, e.g., by adding more cartridges. Data throughput may be increased by adding cartridges because each data range module is able to function in parallel to one another. For example, if an archival storage system with a single rack of cartridges can be completely filled in 15 days, a larger deployment of a dozen racks of cartridges can still be filled within 15 days due to the parallel nature of each data range module.

FIG. 1A is a perspective plan view of a multiple-data-storage-devices cartridge 100 ("the cartridge 100") and components therein, consistent with various embodiments. The cartridge 100 includes an enclosure shell 102 (partially shown) that encloses and protects multiple data storage devices 104. The data storage devices 104 may be hard drives, solid-state drives, flash drives, tape drives, or any combination thereof. It is noted that the term "enclose" does not necessarily require sealing the enclosure and does not necessarily require enveloping all sides of the enclosure.

The cartridge 100 further includes control circuitry 106 that manages the power supply of the cartridge 100, the data access to and from the data storage devices 104, and other storage operations to the data storage devices 104. The control circuitry 106 may implement each of its functions as a single component or a combination of separate components.

As shown, the cartridge 100 is adapted as a rectangular prism that sits on an elongated surface 108 of the rectangular prism. Each of the data storage devices 104 may be stacked within the cartridge 100. For example, the data storage devices 104 can stack on top of one another into columns. The control circuitry 106 can stack on top of one or more of the data storage devices 104 and one or more of the data storage devices 104 can also stack on top of the control circuitry 106.

In various embodiments, the enclosure shell 102 encloses the data storage devices 104 without providing window openings to access individual data storage devices or individual columns of data storage devices. In these embodiments, each of the cartridge 100 is disposable such that after a specified number of the data storage devices 104 fail, the entire cartridge can be replaced as a whole instead of replacing individual failed data storage devices. Alternatively, the cartridge 100 may be replaced after a specified time, e.g., corresponding to an expected lifetime.

The illustrated stacking of the data storage devices 104 in the cartridge 100 enables a higher density of standard disk drives (e.g., 3.5 inch disk drives) in a standard shelf (e.g., a 19 inch width rack shelf). Each of the cartridge 100 can store ten of the standard disk drives. In the cases that the data storage devices 104 are disk drives, the cartridge 100A can hold the disk drives "flat" such that the axes of the spinning disks are parallel to the gravitational field.

The cartridge 100 may include a handle 110 on one end of the enclosure shell 102 and a data connection port 112 (not shown) on the other end. The handle 110 is attached on an outer surface of the enclosure shell 102 to facilitate carrying of the cartridge 100. The enclosure shell 102 exposes the handle 110 on its front surface. For example, the handle 110 may be a retractable handle that retracts to fit next to the front surface when not in use.

Figure 1B:
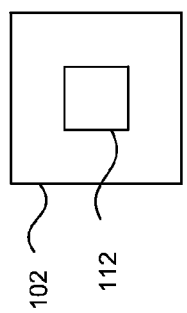
FIG. 1B is a backside view of the multiple-data-storage-devices cartridge of FIG. 1A, consistent with various embodiments.

FIG. 1B is a backside view of the multiple-data-storage-devices cartridge 100, consistent with various embodiments. For example, the backside view can be taken from a perspective along A-A' as shown in FIG. 1A. The enclosure shell 102 encloses the data storage devices 104 (not shown) and the control circuitry 106 (not shown), and exposes a data connection port 112, e.g., an Ethernet port. The data connection port 112 is a component attached to the control circuitry 106. The data connection port 112 is an interconnection interface that accepts or plugs into a communication medium, e.g., Ethernet cable. The data connection port 112 may be the only component within the cartridge 100 exposed outside the enclosure shell 102. For example, the data connection port 112 can accept an Ethernet cable carrying communication signals and power in accordance with the Power-over-Ethernet (PoE) standards (e.g., IEEE 802.3af-2003 or IEEE 802.3at-2009).

Figure 1C:
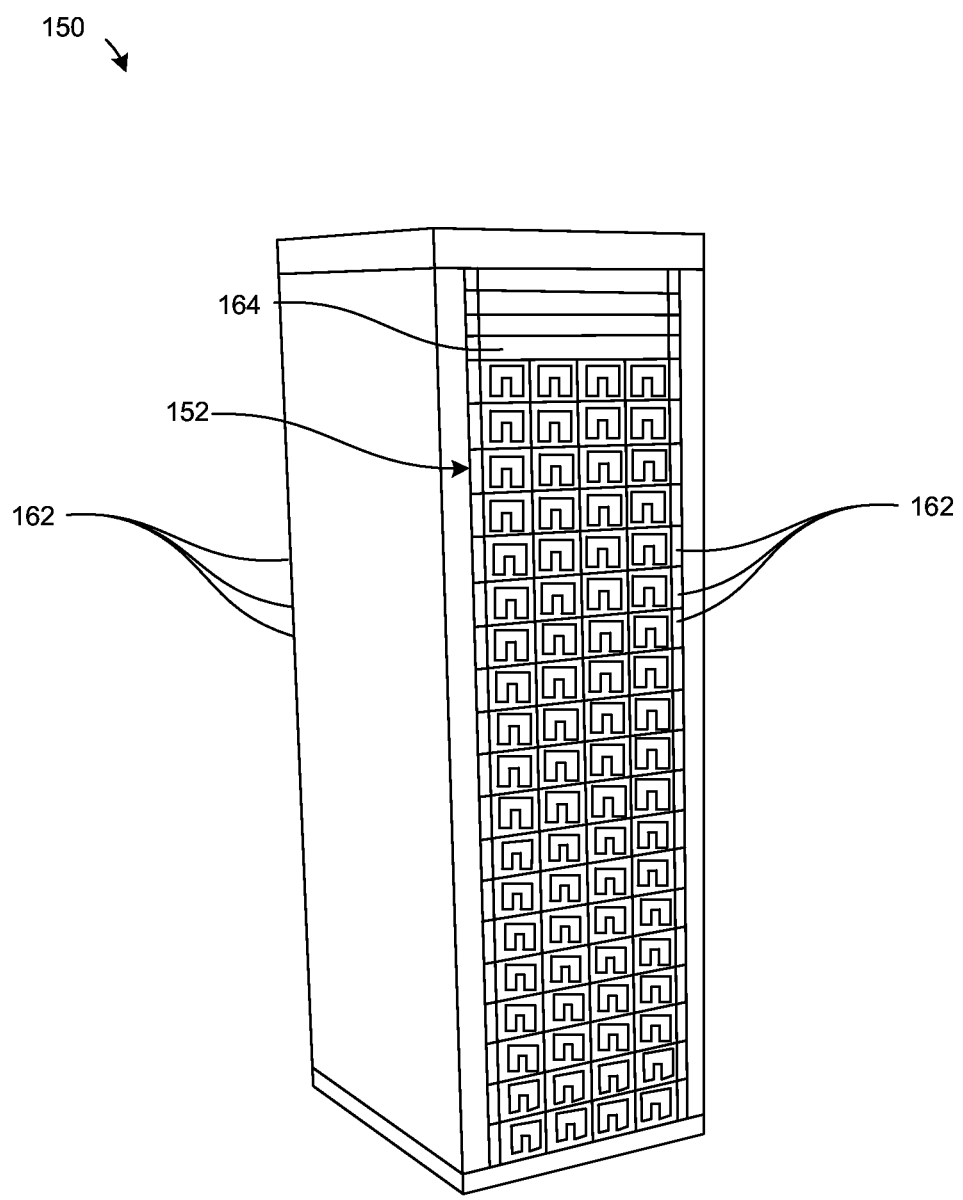
FIG. 1C is a perspective view of a rack of multiple-data-storage-devices cartridges, consistent with various embodiments.

FIG. 1C is a perspective view of a rack 150 of multiple-data-storage-devices cartridges, consistent with various embodiments. The multiple-data-storage-devices cartridges may be instances of the cartridge 100 illustrated in FIG. 1A. The rack 150, as illustrated, includes a tray structure 152 (e.g., a rack shelf) securing four instances of the cartridge 100. The tray structure 152 can be a standard 2U 19" deep rack mount. The rack 150 may include a stack of tray structures 152, each securely attached to a set of rails 162. Management devices 164 may be placed at the top shelves of the rack 150. For example, the management devices 164 may include network switches, power regulators, front-end storage appliances, or any combination thereof.

Figure 2:
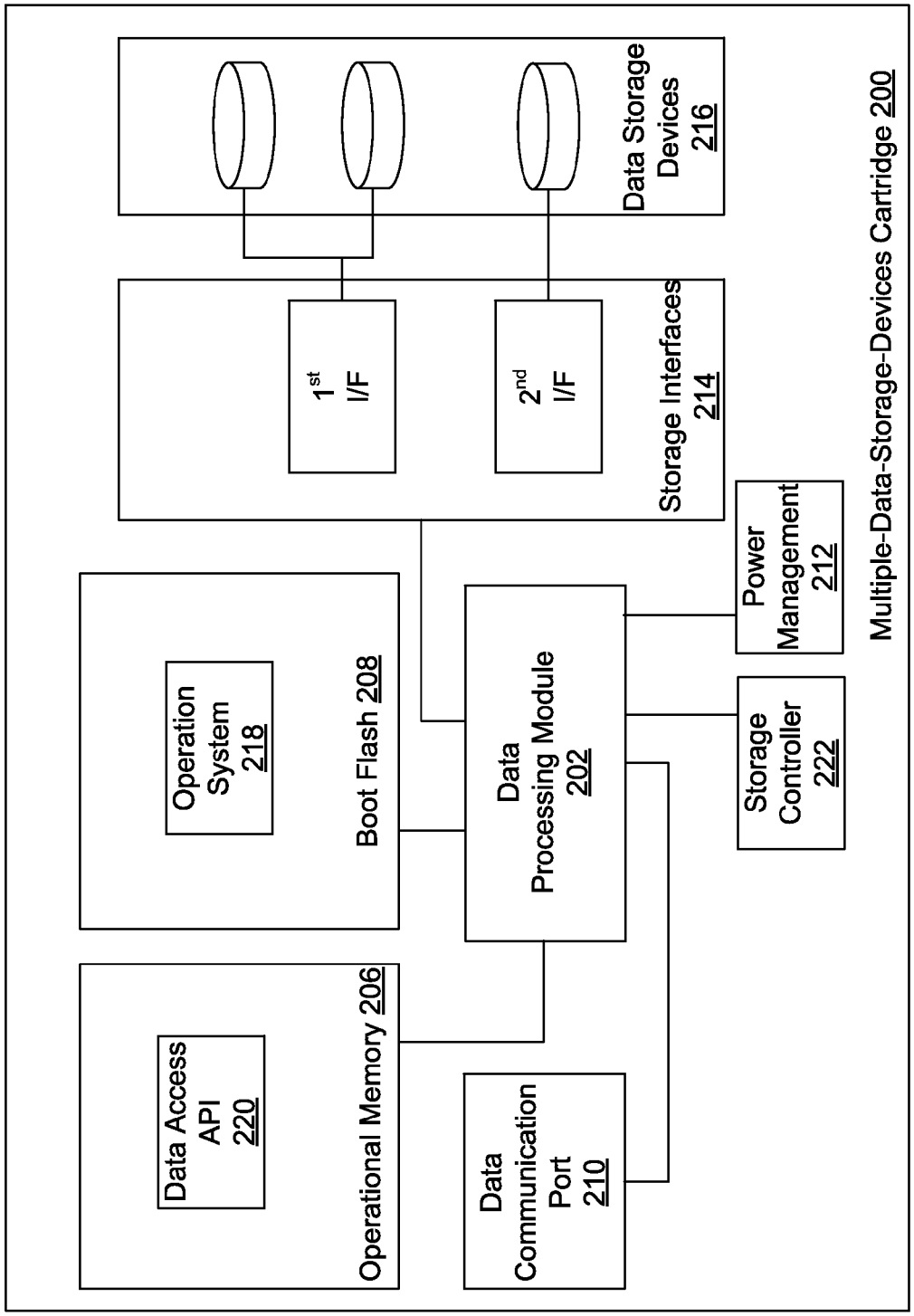
FIG. 2 is a block diagram of a multiple-data-storage-devices cartridge, consistent with various embodiments.

FIG. 2 is a block diagram of a multiple-data-storage-devices cartridge 200, in accordance with various embodiments. The multiple-data-storage-devices cartridge 200 (the "cartridge 200") can be the cartridge 100 of FIG. 1A. The cartridge 200 includes a data processing module 202, an operational memory 206, a boot flash 208, a data communication port 210, a power management module 212, storage interfaces 214, and data storage devices 216.

The data processing module 202 can be a microprocessor, a controller, an application-specific integrated circuit, a field programmable gate array, or any combination thereof. The boot flash 208 is a memory device storing an operating system 218. The data processing module 202 can load the operating system 218 into the operational memory 206 and run the operating system 218. A data access application programming interface (API) service 220 can execute on this operating system to provide data access over a network to the data storage devices 216 for clients (e.g., devices, applications, or systems).

The data communication port 210 enables the cartridge 200 to connect with the network. For example, the data communication port 210 can be a Power-over-Ethernet module that connects to an Ethernet cable to both establish a network connection with the network and power the cartridge 200.

In various embodiments, the cartridge 200 only turns on a subset (hereinafter the "active set") of data storage devices 216 at a time. The active set can be a single data storage device or more than one data storage devices. The data access API service 220 can determine the membership of the active set depending on client requests received through the network. A client can either specifically request access to a data storage device or request a data range for the data access API service 220 to determine which data storage device stores the data range.

The power management module 212 provides electronic circuitry to switch on and off components of the cartridge 200, e.g., to activate only one subset of the data storage devices at a time. The power management module 212 can receive instructions from the data processing module 202 (e.g., as part of the data access API service 220) to provide power to the designated active set, including a subset of the storage interfaces 214 that enables data access to the active set. Once power is supplied to the designated active set, the storage controller 222 can facilitate communicate between the data processing module 202 through the storage interface 214 to the data storage devices.

Figure 3:
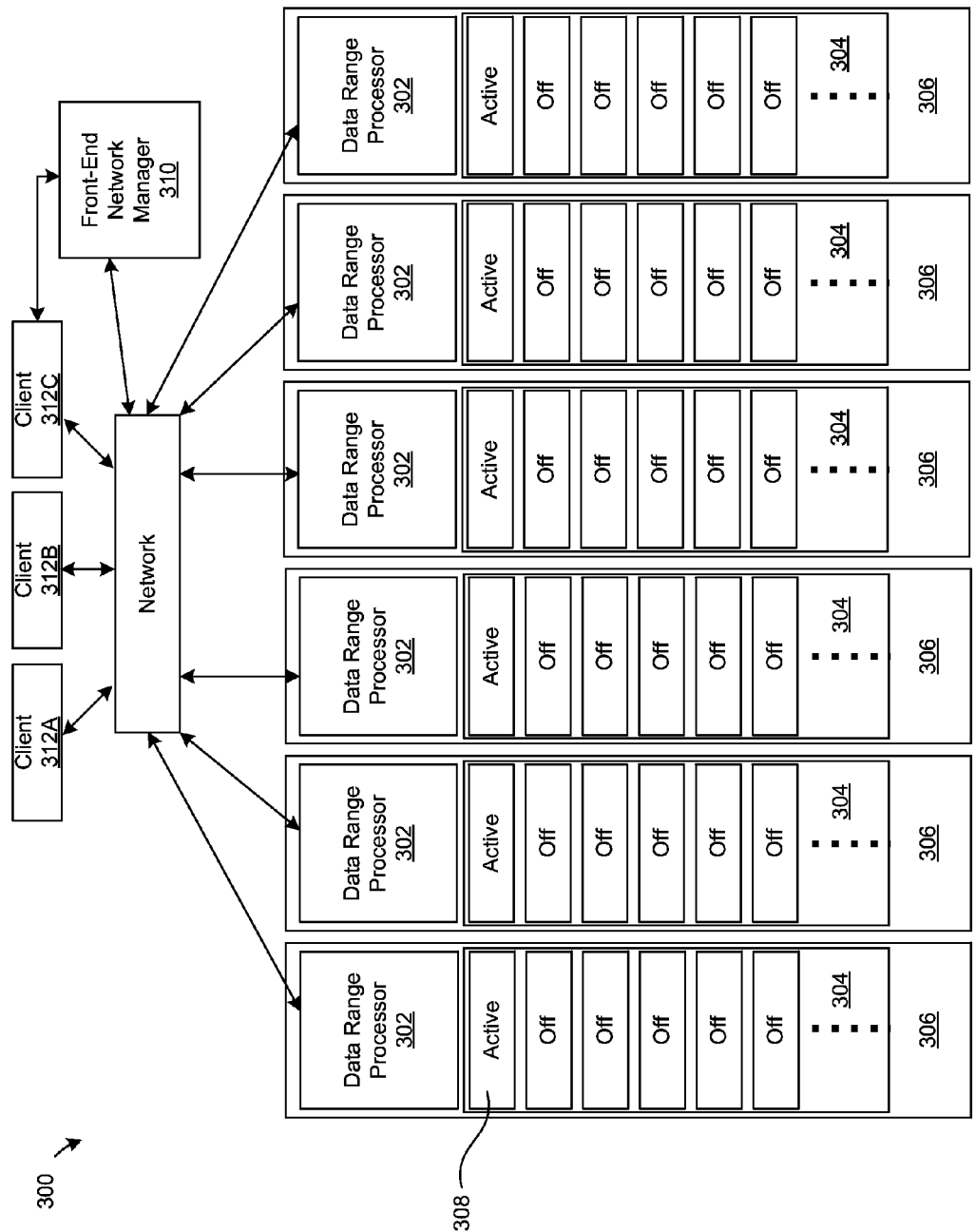
FIG. 3 is a block diagram illustrating a system architecture of an archival storage system, consistent with various embodiments.

FIG. 3 is a block diagram illustrating a system architecture of an archival storage system 300, consistent with various embodiments. The archival storage system 300 includes multiple data range processor modules 302, each managing multiple data storage devices 304 (e.g., the data storage devices 104 of FIG. 1A or the data storage devices 216 of FIG. 2). Each data range processor module 302 is implemented in a multiple-data-storage-devices enclosure 306. As shown, each data range processor module 302 activates only one active storage device 308 at a time, where the active storage device 308 is selected by the data range processor module 302 from the data storage devices 304.

Each data range processor module 302 can be implemented as a data access API service (e.g., the data access API service 220 of FIG. 2) running on an operating system implemented by a data processing component (e.g., the data processing module 202 of FIG. 2) of the multiple-data-storage-devices enclosure 306 (e.g., the cartridge 100 of FIG. 1A or the cartridge 200 of FIG. 2). Each data range processor module 302 operates in parallel to one another. The data access API service may be implemented under the Representational State Transfer (REST) architecture as a "RESTful http" service. For example, the API service can include an interface to authenticate a client, to respond to a request for a list of data ranges, to identify supporting capabilities of the API service, to retrieve a data range, and to retrieve metadata about a data range.

The consumer of the API service provided by the data range processor modules 302 can either be a front-end network manager 310 or one of clients 312 (e.g., client 312A, client 312B, and client 312C, collectively as the "clients 312"). The front-end network manager 310 manages access to the multiple data range processor modules 302. The front-end network manager 310 receives data access requests from the clients 312, including write requests and read requests. For each data access request from the clients 312, the front-end network manager 310 can sub-divide the data access request into sub-requests, including write sub-requests for portions of payload data indicated in a master write request and read sub-requests for portions of a requested dataset indicated in a master read request.

When writing data, the front-end network manager 310 or one of the clients 312 sends a directed, broadcast/multicast or fanout message to one or multiple data range processor modules 302 announcing an intent to store data and the nature of the request, e.g., the size of the payload data to be written. The nature of the write request may also include any data processing or data maintenance requests associated with the write request. Each of the data range processor modules 302 then determines whether to respond to the received message. This determination may be based at least partly on whether the responding data range processor module has an operable data storage device capable of storing a contiguous range of data matching the size of the payload data. That is, whether one of the active or inactive data storage devices managed by the responding data range processor module has sufficient available memory space for the size of the payload data.

In some cases, multiple data range processor modules respond to the broadcast/multicast message. The front-end network manager 310 or the requesting client can select which of the respondent modules (i.e., those data range processor modules that responded) are to receive the payload data. One or more of respondent modules may be selected, each either to store the entire payload data as mirrors of one another or to store a divided or encoded portion of the payload data. The front-end network manager 310 or the requesting client can select the respondent modules based at least partly on the order of when each respondent module responded to the directed, broadcast/multicast, or fanout message, a load-balancing factor associated with the respondent module, amount of capacity available to the respondent module, age of the respondent module, likelihood of failure of the respondent module, importance of the payload data, a geolocation of the respondent module, or any combination thereof.

After the front-end network manager 310 or the requesting client selects which of the respondent modules to send the payload data or portions of the payload data, the front-end network manager 310 or the requesting client delivers the payload data or the portions of the payload data to the selected respondent modules. The delivering of the payload data or the portions of the payload data may be in response to selection of the respondent modules. At least some of the selected respondent modules lay down the payload data or a received portion of the payload data on the active storage device 308 as a range (i.e., contiguous data).

When laying down the range, each data range processor module 302 does not go back and modify data already written. All data is written only once to the data storage devices 304. In various embodiments, incoming ranges are laid down starting from a last written point on the active storage device 308. If the respondent module has no record of a last written point, sector zero of the active storage device 308 is set as the starting point.

Each data range processor module 302 can maintain a range identifier table that associates the active storage device 308 with the written data ranges. The range identifier table can later be used to locate the written data ranges. The data ranges can also be written in a self-describing data layout. For example, as a data range is written to the active storage device 308, a range identifier and size/length of the data range is also written (e.g., as a header or a footer). Each of the data range processor modules 302 lays down data ranges in its active storage device 308 sequentially. Later, when attempting to recover what is written on a data storage device, a skip-seek mechanism can be used to scan across the data storage device by looking for the headers or footers of the data layout to reconstruct the range identifier table. Under this data layout, the archival storage system 300 does not support modification or deletion of the data ranges. Likewise, when reading a data range from the active storage device 308, a data range processor module streams the data range to the requesting party sequentially (as opposed to block-based access).

In the disclosed architecture, the front-end network manager 310 and the clients 312 are API consumers of the data access API services provided by the multiple data range processor modules 302. The front-end network manager 310 and the clients 312 are unaware which data storage devices are activated versus deactivated/powered down. Under this architecture, the data range processor modules 302 function independently of one another.

From an architectural standpoint, the overall storage capacity of the archival storage system 300 can be scaled by adding more data storage devices 304 to each of the multiple-data-storage-devices enclosure 306. The overall throughput of the archival storage system 300 can be scaled by adding more of the multiple data storage devices enclosures. Consequently, the overall storage capacity of the archival storage system 300 is also increased when additional multiple data storage devices enclosures are added.

In some embodiments, the front-end network manager 310 or the clients 312 can store a metadata structure mapping data ranges to the multiple data range processor modules 302. For example, responsive to receiving a read request for a data range from one of the clients 312, the front-end network manager 310 can first select which of the data range processor modules to contact via the metadata structure, and then request the data range from the selected data range processor module(s). The metadata structure can also include an indication of the specific data storage devices managed by the data range processor modules 302 that are storing the data ranges.

In such cases, a range request to the selected data range processor module(s) also indicates to the selected data range processor module(s) which data storage device(s) to activate. Alternatively, the data range processor modules 302 can store their own metadata structure mapping data ranges to the multiple data storage devices 304. In such cases, each of the selected data range processor module(s) can activate a specific data storage device or subset of data storage devices in response to the range request and retrieve the requested data range for the front-end network manager 310.

In other embodiments, when retrieving a specific data range, the front-end network manager 310 or the clients 312 can send a broadcast/multicast message querying the data range processor modules 302 for the specific data range, e.g., using a range identifier or label. In these embodiments, the data range processor modules 302 keep track of which data ranges they have (e.g., through a table of data range identifiers and/or hash values) and the corresponding data storage devices storing the data ranges. A data range processor module that is aware of the specific data range can then activate a corresponding data storage device containing the specific data range, retrieve the specific data range, and respond to the broadcast/multicast message with the retrieved data range.

In various embodiments, multiple data range processor modules storing the same fragment of data can respond to a broadcast/multicast read request. The front-end network manager 310 can take the first copy it receives to process the retrieval of the requested data object.

In various embodiments, the multiple data range processor modules 302 not only service external clients and/or the front-end network manager 310, but also perform data storage device management services, including data storage device health monitoring, data storage device decommissioning, data recovery, failure recovery, or any combination thereof. The multiple data range processor modules 302 can also maintain data management services, including updating the metadata structures of data ranges.

The data range processor modules 302 do not support deletion or modification of data ranges. If the clients 312 send a request to "delete" or "modify" a data range, a data range processor module can mark the data range as "gone" or "deleted." The data range processor module does not reclaim this memory space while the active storage device 308 is in operation. Instead, if the active storage device 308 has enough data ranges marked as "deleted," the remaining data is migrated off the active storage device 308 to be preserved, and the active storage device 308 is wiped clean. Subsequently, the active storage device 308 can be reused as an empty data storage device.

Figure 4:
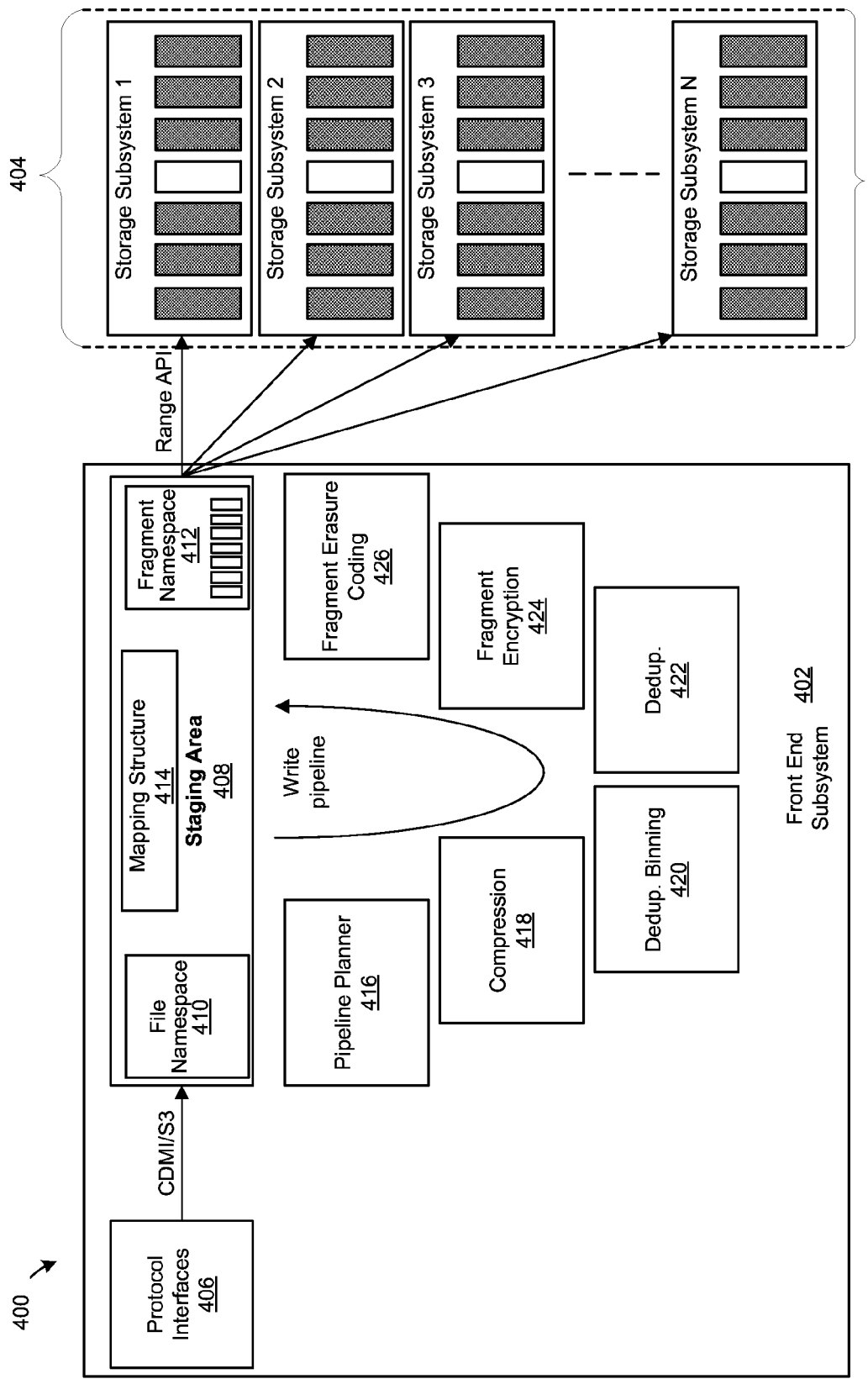
FIG. 4 is a control flow diagram of the archival storage system, consistent with various embodiments.

FIG. 4 is a control flow diagram of an archival storage system 400, consistent with various embodiments. The archival storage system 400 includes a front-end subsystem 402 (e.g., the front-end network manager 310 of FIG. 3) and multiple storage subsystems 404 (e.g., the cartridge 100 of FIG. 1A, the cartridge 200 of FIG. 2, or the multiple-data-storage-devices enclosure 306 of FIG. 3). The front-end subsystem 402 can be one or more computer systems (e.g., the computing device 1200 of FIG. 12), having either a shared nothing architecture or a shared database architecture, connected to the storage subsystems 404 over a network (e.g., a global network or a local network). The front-end subsystem 402 can be on a separate rack from the storage subsystems 404.

The front-end subsystem 402 includes a protocol interfaces module 406. The protocol interfaces module 406 defines one or more functional interfaces that applications and devices used to store, retrieve, update, and delete data elements from the archival storage system 400. For example, the protocol interfaces module 406 can implement a Cloud Data Management Interface (CDMI), a Simple Storage Service (S3) interface, or both. While the archival storage system 400 is adapted to never delete or update any written data, the archival storage system 400 can emulate a deletion of data ranges by removing metadata associated with the data ranges and/or marking an indication that the memory spaces occupied by the data ranges are available for overwrite. The archival storage system 400 can emulate an update by storing an updated data range as a new data range, updating metadata associated to the updated data range, and marking any metadata associated of the old data range with an indication of deletion.

The front-end subsystem 402 also includes a staging area 408. The staging area 408 is a memory space implemented by one or more data storage devices within or accessible to the front-end subsystem 402. For example, the staging area 408 can be implemented by solid-state drives, hard disks, volatile memory, or any combination thereof. The staging area 408 can maintain a file namespace 410 to facilitate client interactions through the protocol interfaces module 406. The file namespace 410 manages a set of data container identifiers, each corresponding to a dataset from clients of the front-end subsystem 402. The staging area 408 also maintains a fragment namespace 412 corresponding to the file namespace 410. The fragment namespace 412 manages a set of fragment identifiers, each corresponding to a data range stored in the multiple storage subsystems 404. The staging area 408 can store a mapping structure 414 that stores associations between the data container identifiers of the file namespace 410 and the fragment identifiers of the fragment namespace 412.

In some embodiments, the front-end subsystem 402 can be implemented as a distributed computing network including multiple computing nodes (e.g., computer servers). Each computing node can include an instance of the staging area 408. The namespaces (e.g., the file namespace 410 and the fragment namespace 412) of each staging area 408 can be implemented either as a share-nothing database or a shared database.

The staging area 408 can also serve as a temporary cache to process payload data from a write request received at the protocol interfaces module 406. The front-end subsystem 402 can process incoming write requests via a data processing pipeline through a pipeline planner module 416. When the pipeline planner module 416 receives an incoming write request, the pipeline planner module 416 can determine what types of storage efficiency processes to perform on the payload data of the write request prior to sending the payload data into persistent storage in the storage subsystems 404. The storage efficiency processes include compression of the payload data as implemented by a compression module 418, deduplication of the payload data as implemented by a deduplication binning module 420 and a deduplication module 422, fragment encryption as implemented by a fragment encryption module 424, and erasure coding as implemented by a fragment erasure coding module 426. The pipeline planner module 416 can improve storage efficiency by allocating processing time (e.g., as measured by absolute time, processing cycles, or process iterations) to each of these storage efficiency processes. While the storage efficiency processes is illustrated in FIG. 4 in a given order, alternative embodiments may perform these storage efficiency processes in a different order, and some processes may be removed, moved, added, subdivided, combined, and/or modified to provide alternatives or sub-combinations. The scheduled order of storage efficiency processes can be saved to enable a reversal of the storage efficiency processes in order to execute a subsequently received client read request to retrieve the payload data.

The compression module 418 implements one or more compression algorithms. The pipeline planner module 416 can schedule the compression module 418 to try a subset or all of the one or more compression algorithms on the payload data. The compressed payload data taking up the least memory space can then be piped to the next storage efficiency process.

The deduplication binning module 420 implements one or more deduplication binning techniques. The term "deduplication binning" here refers to a method of splitting data chunks (e.g., the payload data chunks or the compressed payload data chunks) into data fragments ("bins") and performing deduplication against a chosen fragment of chunks. The deduplication module 422 implements one or more deduplication techniques working in conjunction with the one or more deduplication binning techniques. The pipeline planner module 416 can schedule for any combination of deduplication binning techniques and deduplication techniques on the payload data or the compressed payload data. The deduplicated payload data from a combination of deduplication binning and deduplication techniques with the best result (e.g., largest amount of redundant data removed) can then be piped to the next storage efficiency process.

The fragment encryption module 424 implements one or more encryption techniques. The pipeline planner module 416 can schedule the fragment encryption module 424 to encrypt fragments of the incoming data (e.g., deduplicated and compressed payload data). As part of the deduplication binning process, the payload data can be split into data fragments. The fragment encryption module 424 can encrypt the resultant fragments of the payload data from the deduplication process. The encrypted fragments are then piped to the next storage efficiency process.

The fragment erasure coding module 426 implements one or more erasure coding techniques. The term "erasure coding" herein refers to transforming payload data of k fragments into erasure coded data of N fragments, where N>k, such that the payload data can be recovered from a subset of the N. The pipeline planner module 416 can schedule the fragment erasure coding module 426 to try a subset or all of the one or more erasure coding techniques on the incoming fragments (e.g., deduplicated fragments and/or encrypted fragments). As part of the deduplication binning process or the fragment encryption process, the payload data can be split into data fragments. The fragment erasure coding module 426 can erasure code the resultant fragments of the payload data from the deduplication process and/or the fragment encryption process. The erasure coded fragments with the optimal code rate and reception efficiency are then piped to the next storage efficiency process. The term "code rate" herein refers to the fraction k/N and the term "reception efficiency" refers to the fraction k'/k, where k' denotes the minimum number of fragments needed for recovery of the payload data.

Figure 5:
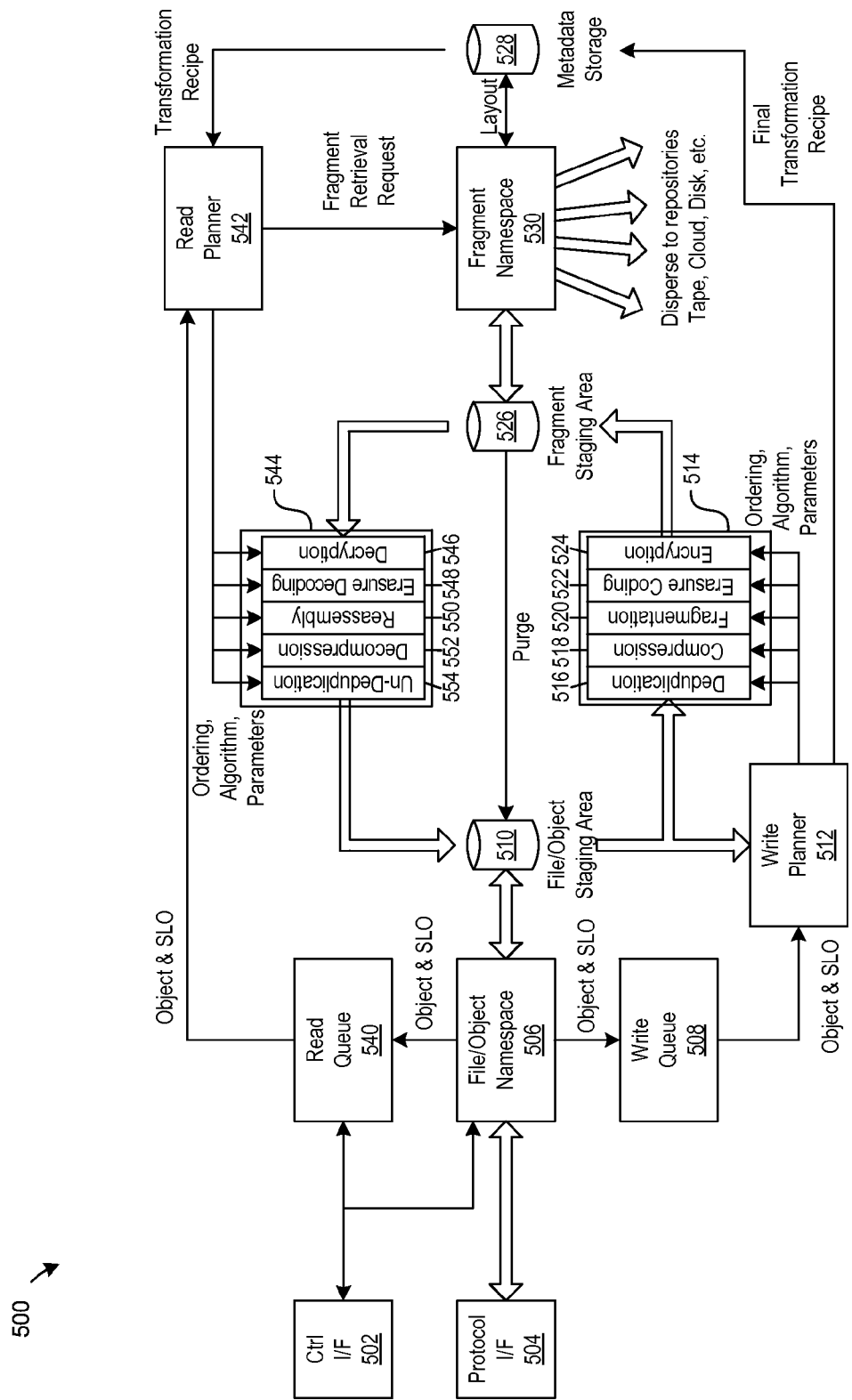
FIG. 5 is a control flow diagram of a storage front-end system, consistent with various embodiments.

FIG. 5 is a control flow diagram of a storage front-end system 500, consistent with various embodiments. The storage front-end system 500 may be a front-end subsystem (e.g., the front-end subsystem 402) for an archival storage system, e.g., the archival storage system 300 of FIG. 3 or the archival storage system 400 of FIG. 4. The storage front-end system 500 includes one or more control interfaces 502 and one or more protocol interfaces 504. The control interfaces 502 can provide monitoring, management configuration and other non-data-related functions. The protocol interfaces 504 feed into the file/object namespace module 506 (e.g., the file namespace 410 of FIG. 4). The protocol interfaces 504 can be the Cloud Data Management Interface (CDMI) interface or the S3 interface. The protocol interfaces 504 enable the storage front-end system 500 to interact with clients over a network. The protocol interfaces 504 can deliver client requests including both read requests and write requests to the file object namespace module 506. A client request can include an object identifier and a service level objective (SLO) of the request.

If the client request is a write request, the file object namespace module 506 adds the write request (e.g., including a data object identifier and a write request SLO) to a write queue 508. The payload of the write request can be stored in a file object staging area 510 (e.g., the staging area 408 of FIG. 4). The write queue 508 can process write requests cached therein in the order the write requests are received (absent a message that overwrites a priority of one of the write requests), or process write requests out of order. The write queue 508 can process each write request through a write planner module 512 (e.g., the pipeline planner module 416 of FIG. 4). Based on the payload data and other information in the write request (e.g., the SLO), the write planner module 512 selects storage preprocessing techniques that are used to process the write request. The write planner module 512 can also determine an ordering of how the storage preprocessing techniques are to apply on the payload data and parameters for running the storage preprocessing techniques. The write planner module 512 can transmit the selection of techniques, the ordering of applying the techniques, and the parameters for the techniques in a transformation recipe to a storage preprocessor subsystem 514. The write planner module 512 can operate iteratively. That is, the write planner module 512 can plan to try a permutation of techniques and/or options for the techniques, and based on the tested result, further changes the options or the techniques to try to optimize one or more variables (e.g., storage performance indicators) to achieve a better end result.

The storage preprocessor subsystem 514 implements the storage preprocessing techniques. For example, the storage preprocessor subsystem 514 can include a deduplication module 516 (e.g., the deduplication module 422 and the deduplication binning module 420 of FIG. 4), a compression module 518 (e.g., the compression module 418 of FIG. 4), a fragmentation module 520 to divide the payload data into fragments (e.g., for deduplication binning, erasure coding, and/or fragment encryption), an erasure coding module 522 (e.g., the fragment erasure coding 426 of FIG. 4), an encryption module 524 (e.g., the fragment encryption module 424 of FIG. 4), or any combination thereof. The storage preprocessor subsystem 514 can also include one or more of the compression module 418 of FIG. 4, the deduplication binning module 420 of FIG. 4, the deduplication module 422 of FIG. 4, the fragment encryption module 424 of FIG. 4, and the fragment erasure coding module 426 of FIG. 4.

After processing the payload data in accordance with the chosen transformation recipe, the storage preprocessor subsystem 514 deposits the processed fragments into a fragment staging area 526. The transformation recipe for the processed fragments stored as part of one or more of the fragments, and can also be stored into a metadata storage 528. The metadata storage 528 stores both the transformation recipe and optionally a data layout of the processed fragments. The signal path labeled "purge" allows the storage front-end system 500 to reclaim space in the File/Object Namespace 506 when the data is fully stored as fragments.

A fragment namespace module 530 can retrieve the processed fragments from the fragment staging area 526 and store the processed fragments to one or more repositories. For example, the repositories can include tape drives, cloud storage, local or external disk drives, the cartridge 100 of FIG. 1A, the cartridge 200 of FIG. 2, the multiple-data-storage-devices enclosure 306 of FIG. 3, the storage subsystems 404 of FIG. 4, or any combination thereof. The fragment namespace module 530 can store the data layout of the processed fragments in the metadata storage 528.

If the client request is a read request, the file object namespace module 506 adds the read request (e.g., including a requested data object identifier and a read request SLO) to a read queue 540. The read queue 540 can process read requests cached therein in the order the read requests are received (absent a message that overwrites a priority of one of the read requests), or process the reads out of order. The read queue 540 can process each read request through a read planner module 542. Based on the data object identifier and other information in the read request (e.g., the SLO), the read planner module 542 can retrieve a transformation recipe corresponding to the requested data object from the metadata storage 528 or from a corresponding fragment.

The read planner module 542 can send a fragment retrieval request to the fragment namespace module 530. In response, the fragment namespace module 530 can retrieve the fragments corresponding to the requested data object from the repositories. The fragment namespace module 530 can identify the data layout of the fragments corresponding to the requested data object from the metadata storage 528.

The read planner module 542 can then send the retrieved fragments to a reverse processor subsystem 544 to reconstruct the requested data object from the retrieved fragments. Based on the transformation recipe, the read planner module 542 can select reverse processing techniques, an ordering of how the reverse processing techniques are to apply on the retrieved fragments, and parameters for running the reverse processing techniques. The read planner module 542 can send the retrieved fragments along with the selection of techniques, the ordering of the techniques, and the parameters of the techniques.

The reverse processor subsystem 544 may include a decryption module 546, an erasure decoding module 548, a reassembly module 550, a decompression module 552, an un-deduplication module 554, or any combination thereof. The decryption module 546 can apply one or more decryption techniques on the fragments, each technique utilizing a cryptographic key. The decryption module 546 can be configured in association with the encryption module 524. For example, the decryption module 546 and the encryption module 524 can share a symmetric key or can each possess an asymmetric key coupled to one another (e.g., a private decryption key and a public encryption key). The erasure decoding module 548 can reconstruct an original set of fragments utilizing all or a subset of erasure coded fragments. The erasure decoding module 548 can be configured in association with the erasure coding module 522 such that the erasure decoding module 548 can reverse the effects of the erasure coding module 522.

The reassembly module 550 can assemble the de-processed fragments back to a continuous dataset. The reassembly module 550 can be configured in association with the fragmentation module 520 to reverse the effects of the fragmentation module 520. The decompression module 552 can execute one or more decompression techniques to expand a compressed dataset to its raw format. The decompression module 552 can be configured in association with the compression module 518 to reverse the effects of the compression module 518. The un-deduplication module 554 can be configured in association with the deduplication module 516 to reverse the effects of the deduplication module 516.

After the reverse processor subsystem 544 reconstructs the original data object, the reverse processor subsystem 544 deposits the original data object in the file/object staging area 510. The original data object can be a file, an object, a volume, a data range sequence, a binary string, a data aggregate, or any combination thereof. The file/object namespace module 506 can determine when the original data object is deposited into the file object staging area 510. In response, the file/object namespace module 506 can respond to the read request via at least one of the protocol interfaces 504 by sending the original data object back to the client.

Implementations of the storage preprocessor subsystem 514 and the reverse processor subsystem 544 enable the storage front-end system 500 to improve storage efficiency using storage processing pipeline optimization. The storage preprocessor subsystem 514 implements a pipeline of storage preprocessing techniques that improves storage efficiency. The storage preprocessor subsystem 514 presumes that the repositories utilized by the fragment namespace module 530 are high-latency storage devices, e.g., the multiple-data-storage-devices enclosure 306 where storage devices therein are frequently deactivated. Because of this, the storage preprocessor subsystem 514 utilizes the additional time to optimize the pipeline for even higher storage efficiency that traditional systems could not previously achieve.

Regarding FIGS. 1-5, portions of components and/or modules associated with the cartridge 100, the cartridge 200, the archival storage system 300, the archival storage system 400, and the storage front-end system 500 may each be implemented in the form of special-purpose circuitry, or in the form of one or more appropriately programmed programmable processors, or a combination thereof. For example, the modules described can be implemented as instructions on a tangible storage memory capable of being executed by a processor or a controller in the control circuitry. The tangible storage memory may be volatile or non-volatile memory. In some embodiments, the volatile memory may be considered "non-transitory" in the sense that it is not a transitory signal. Modules may be operable when executed by a processor or other computing device, e.g., a single board chip, an application specific integrated circuit, a field programmable field array, a network capable computing device, a virtual machine terminal device, a cloud-based computing terminal device, or any combination thereof. Memory spaces and storages described in the figures can be implemented with the tangible storage memory as well, including volatile or non-volatile memory.

Each of the modules and/or components may operate individually and independently of other modules or components. Some or all of the modules may be executed on the same host device or on separate devices. The separate devices can be coupled together through one or more communication channels (e.g., wireless or wired channel) to coordinate their operations. Some or all of the components and/or modules may be combined as one component or module.

A single component or module may be divided into sub-modules or sub-components, each sub-module or sub-component performing a separate method step or method steps of the single module or component. In some embodiments, at least some of the modules and/or components share access to a memory space. For example, one module or component may access data accessed by or transformed by another module or component. The modules or components may be considered "coupled" to one another if they share a physical connection or a virtual connection, directly or indirectly, enabling data accessed or modified from one module or component to be accessed in another module or component. In some embodiments, at least some of the modules can be upgraded or modified remotely. The cartridge 100, the cartridge 200, the archival storage system 300, the archival storage system 400, or the storage front-end system 500 may include additional, fewer, or different modules for various applications.

At least one embodiment involves a method of operating a storage front-end manager system to perform pipeline planning for a high latency storage system. The method can include: receiving a write request including payload data; storing the payload data of the write request in a staging area of the storage front-end manager system; determining a transformation pipeline based at least partly on an attribute of the write request; queuing the transformation pipeline for execution on the payload data to generate data fragments for storage; executing the transformation pipeline; and transmitting the data fragments to a plurality of multiple-data-storage-devices enclosures after the transformation pipeline is executed.

The staging area can be a cache memory with at least a data object namespace and a fragment namespace. The method can further include associating an object identifier of the payload data in the data object namespace and fragment identifiers of the data fragments in the fragment namespace. The method can also further include storing a layout of the data fragments, where the layout indicates which of the plurality of multiple-data-storage-devices enclosures stores each of the data fragments. The layout can also include an indication of which data storage device(s) within each of the plurality of multiple-data-storage-devices stores each of the data fragments. The method can also include tracking a group of data storage devices in the plurality of multiple-data-storage-devices enclosures and associating the group with the object identifier for the payload data.

The attribute of the write request may include a service level objective (SLO) of the write request. When determining the transformation pipeline, the storage front-end manager system can determine the transformation pipeline based at least partly on the SLO.

Determination of the transformation pipeline can include selecting a compression technique to process the payload data, selecting a fragmentation technique to fragment the payload data, selecting a deduplication technique to reduce redundancy in the payload data, selecting an encryption technique to protect the payload data from unauthorized access, and/or an erasure coding technique so that a fraction of the data fragments can reconstruct the payload data. The fragmentation technique can be selected based at least partly on a deduplication binning requirement, an erasure coding requirement, or a combination thereof.

Executing the transformation pipeline can include executing a plurality of storage efficiency steps sequentially and piping an output of each storage efficiency step as an input to a subsequent storage efficiency step to transform the payload data through the transformation pipeline. Determination of the transformation pipeline can also include selecting multiple trial techniques to optimize storage efficiency of a first storage efficiency step of the storage efficiency steps. Executing the transformation pipeline can include executing the multiple trial techniques and selecting one of the multiple trial techniques to transform the payload data based on a measurable metric of how well each of the multiple trial techniques performed in optimizing storage efficiency. The storage front-end manager system can store a transformation recipe of the transformation pipeline in a transformation database. The transformation recipe can include at least transformation techniques used in the storage efficiency steps, an order of the storage efficiency steps, parameters of the transformation techniques, or any combination thereof.

At least one embodiment involves a method of operating a storage front-end manager system to read data. The method can include: receiving a read request including a data object identifier associated with a requested data object; retrieving a transformation recipe associated with the data object identifier and a fragment layout associated with the data object identifier; generating a reverse transformation pipeline based at least partly on the transformation recipe; retrieving data fragments from a plurality of data storage devices based at least partly on the fragment layout; queuing the reverse transformation pipeline for execution on the data fragments to reconstruct the requested data object; and executing the reverse transformation pipeline.

The storage front-end manager system can retrieve the data fragments by transmitting direct, broadcast or multicast, or fanout message, based at least partly on the fragment layout, to request the data fragments from a plurality of multiple-data-storage-devices enclosures and receiving the data fragments from a subset of the plurality of multiple-data-storage-devices enclosures. The storage front-end manager system can receive the data fragments from the subset by asynchronously waiting to receive each of the data fragments from each multiple-data-storage-devices enclosure in the subset. That is, the multiple-data-storage-devices enclosures may each include a subset of the plurality of data storage devices containing the data fragments, and may activate the subset based on its own schedule.

Figure 6:
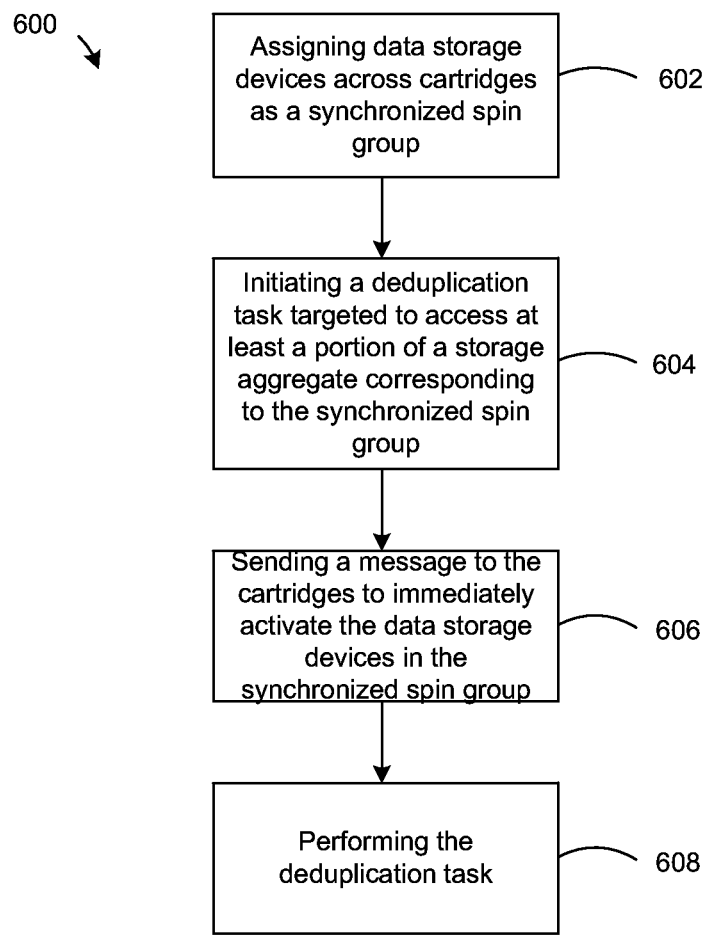
FIG. 6 is a flow chart of a process of synchronized deduplication across a spin group, consistent with various embodiments.

FIG. 6 is a flow chart of a process 600 of synchronized deduplication across a spin group, consistent with various embodiments. The process 600 begins with a storage front-end system assigning, at block 602, data storage devices across two or more multiple-data-storage-devices cartridges (e.g., the cartridge 100 of FIG. 1A, the cartridge 200 of FIG. 2, or the multiple-data-storage-devices enclosure 306 of FIG. 3) as a synchronized spin group. The multiple-data-storage-devices cartridges (the "cartridges") are enclosures containing multiple data storage devices, where each enclosure turns on only a subset of its multiple data storage devices at a time. The storage front-end system can be the front-end subsystem 402 of FIG. 4 or the storage front-end system 500 of FIG. 5. The membership of the synchronized spin group can be stored in the front-end subsystem 402. Each cartridge can be independent of each other, and thus, does not have any knowledge of its data storage devices having memberships in particular synchronized spin groups.

A "spin group" referred to in this disclosure does not imply that the data storage devices within the group necessarily have the ability to spin, such as a hard disk, but rather the member data storage devices are intended, at times, to function as a whole and be activated together. Data stored across the data storage devices of the spin group can be used to reconstruct client data that was processed by the storage front-end system together. In various parts of the disclosure, a "spin group" may be referred to as a "synchronous group" of data storage devices. Under some conditions, the synchronous group can be activated and/or deactivated together by a storage front-end system. Under other conditions, multiple-data-storage-devices enclosures containing members of the same synchronous group can maintain data fragments associated with each other, without necessarily activating the member data storage devices at the same time.

Once assigned together, the cartridges can activate the data storage devices in the synchronized spin group together at the same time. For example, the storage front-end system can send an instruction simultaneously to the multiple-data-storage-devices cartridges containing the member data storage devices to activate the member data storage devices immediately. The cartridges can also deactivate the data storage devices in the synchronized spin group together. Memory space within the synchronized spin group can be presented as a storage "aggregate," a single logical data container across several physical data containers (e.g., data storage devices).

The membership of the synchronized spin group can follow a numerical pattern. For example, the storage front-end system can assign every first disk drive of a set of cartridges as belonging to a first synchronized spin group, every second disk drive of the set of cartridges as belonging to a second synchronized spin group, and etc. This configuration reduces the complexity requirements of managing the memberships of the synchronized spin groups on the storage front-end system.

At block 604, the storage front-end system can initiate a deduplication task that is targeted to access at least a portion of the storage "aggregate" corresponding to the synchronized spin group. Block 604 can be in response to the storage front-end system receiving a client's write request or in response to meeting a deduplication schedule. Responsive to initiating the deduplication task, the storage front-end system can send a message to the cartridges containing members of the synchronized spin group to activate the member data storage devices at block 606. The message can instruct the cartridges to immediately activate the member data storage devices. Alternatively, responsive to the initializing, the deduplication task can be stored in a queue to wait until the synchronized spin group is activated together by a cyclical schedule. For example, the storage front-end system can periodically activate different spin groups in a set sequence.

Once the member data storage devices in the synchronized spin group are activated, the storage front-end system can perform, at block 608, the deduplication task across the storage aggregate formed by the synchronized spin group. Deduplication is a process of eliminating duplicate copies of repeating data within a data container, such as the storage aggregate.

The disclosed technique of deduplicating synchronized spin groups enables deduplication of an expandable aggregate of data storage devices even though the data storage devices are stored in different cartridges and sometimes deactivated (e.g., to save storage maintenance or operational costs). Because the spin group can be activated together, a storage system implementing the process 600 can perform low latency deduplication across a large number of cartridges.

The external management of the membership of the synchronized spin group enables the individual cartridges containing the member data storage devices to remain independent of each other. This architecture can remove or reduce increases in complexity (e.g., complexity associated with maintaining cluster membership information) when scaling the number of cartridges in the archival storage system. While the process 600 is directed at performing a deduplication task across the synchronized spin group, the same process may also be directed at other data maintenance tasks as well.

Some embodiments involve a method of operating a storage front-end system. The method can include: identifying a deduplication group of data storage devices across two or more multiple-data-storage-devices enclosures, wherein data across the data storage devices is accessible by the storage front-end system as an aggregate memory space; transmitting a request to the two or more multiple-data-storage-devices enclosures to near immediately activate the data storage devices; and deduplicating at least a portion of the data in the aggregate memory space by accessing via a data communication network the data storage devices.

The method can further include receiving a write request with payload data, wherein the identifying of the deduplication group can be in response to receiving the write request and the deduplicating can include deduplicating the payload data across the aggregate memory space. Alternatively, the identifying of the deduplication group can be in response to meeting a data maintenance schedule.

Transmitting of the request to activate can be directed at a superset of multiple-data-storage-devices enclosures that includes the two or more multiple-data-storage-devices enclosures. In order for the two or more multiple-data-storage-devices enclosures to recognize that the request is for them, the request can include a group identifier or data storage device identifiers of the deduplication group.

The method can further include determining when the two or more multiple-data-storage-devices enclosures have activated the data storage devices. The deduplicating of the at least a portion of the data can occur after determining that the data storage devices have been activated. The deduplication group can be identified by accessing a group identity storage in the storage front-end system. The group identity storage can include a group identifier associated with identifiers of the data storage devices. The group identifier can also be associated with identifiers of the two or more multiple-data-storage-devices enclosures. The storage front-end system can associate the group identifier with the identifiers of the data storage devices or the multiple-data-storage-devices enclosures when processing deduplication binning of payload data from a write request.

The method can further include initiating a data operation directed at a member data storage device of the deduplication group. In response to initiating the data operation, the storage front-end manger system can request the two or more multiple-data-storage-devices enclosures to activate the deduplication group immediately.

The data storage devices in the deduplication group can share a common attribute across the two or more multiple-data-storage-devices enclosures. For example, the common attribute can be a common enumeration according to the two or more multiple-data-storage-devices enclosures (e.g., each of the data storage devices is the 1st data storage device in its respective enclosure).

Other embodiments involve a different method of operating a storage front-end system. For example, the method can include initiating a data maintenance task that requires access to at least a first data storage device; identifying a synchronous group of data storage devices across two or more multiple-data-storage-devices enclosures that the first data storage device is associated with (i.e., belongs in), wherein data across the data storage devices is accessible by the storage front-end system as an aggregate memory space; sending an activation request to the two or more multiple-data-storage-devices enclosures to nearly immediately activate the data storage devices in the synchronous group; and performing the data maintenance task in the aggregate memory space of the data storage devices. The data maintenance task can be a deduplication process. The data maintenance task can be associated with a read request or a write request.

The activation request can be sent to a superset of multiple-data-storage-devices enclosures that includes the two or more multiple-data-storage-devices enclosures. The activation request can identify the synchronous group of the data storage devices. The method can further include determining when the data storage devices in the synchronous group have been activated. The storage front-end system can then perform the data maintenance task after the data storage devices have been activated.

Performing the data maintenance task can include requesting data fragments from the data storage devices in the synchronous group, and receiving and caching the data fragments from the two or more multiple-data-storage-devices enclosures. The data maintenance task can then be performed based at least in part on the data fragments.

Figure 12:
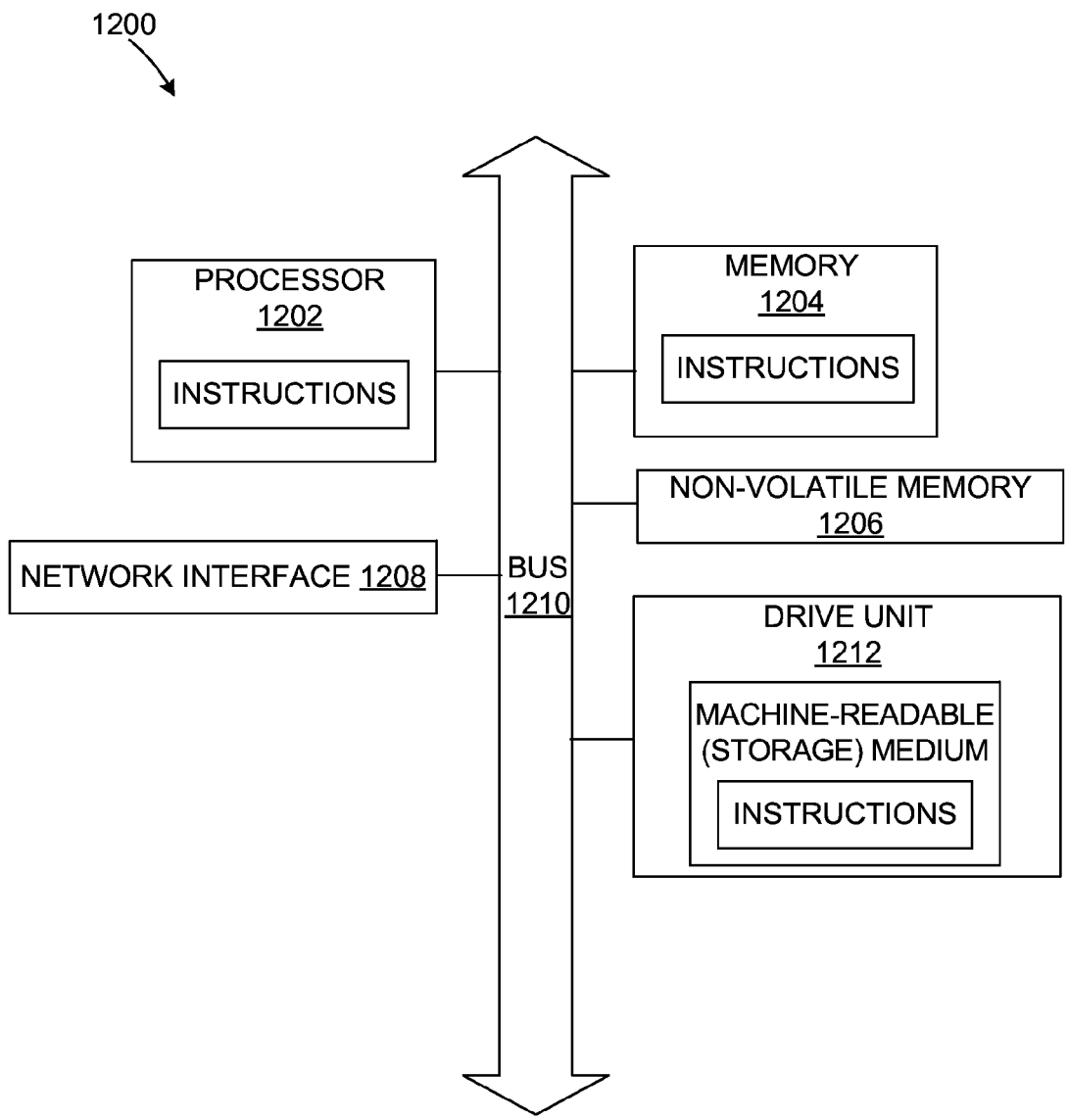
FIG. 12 is a block diagram illustrating a diagrammatic representation of a computing device within which a set of instructions, for causing the machine to perform any one or more of the methodologies or modules discussed herein, may be executed.

In various embodiments, these methods of performing a deduplication task or a data maintenance task associated with the synchronous group of the data storage devices can be performed by a computer system serving as a storage front-end system (e.g., the computer device 1200 of FIG. 12).

Figure 7:
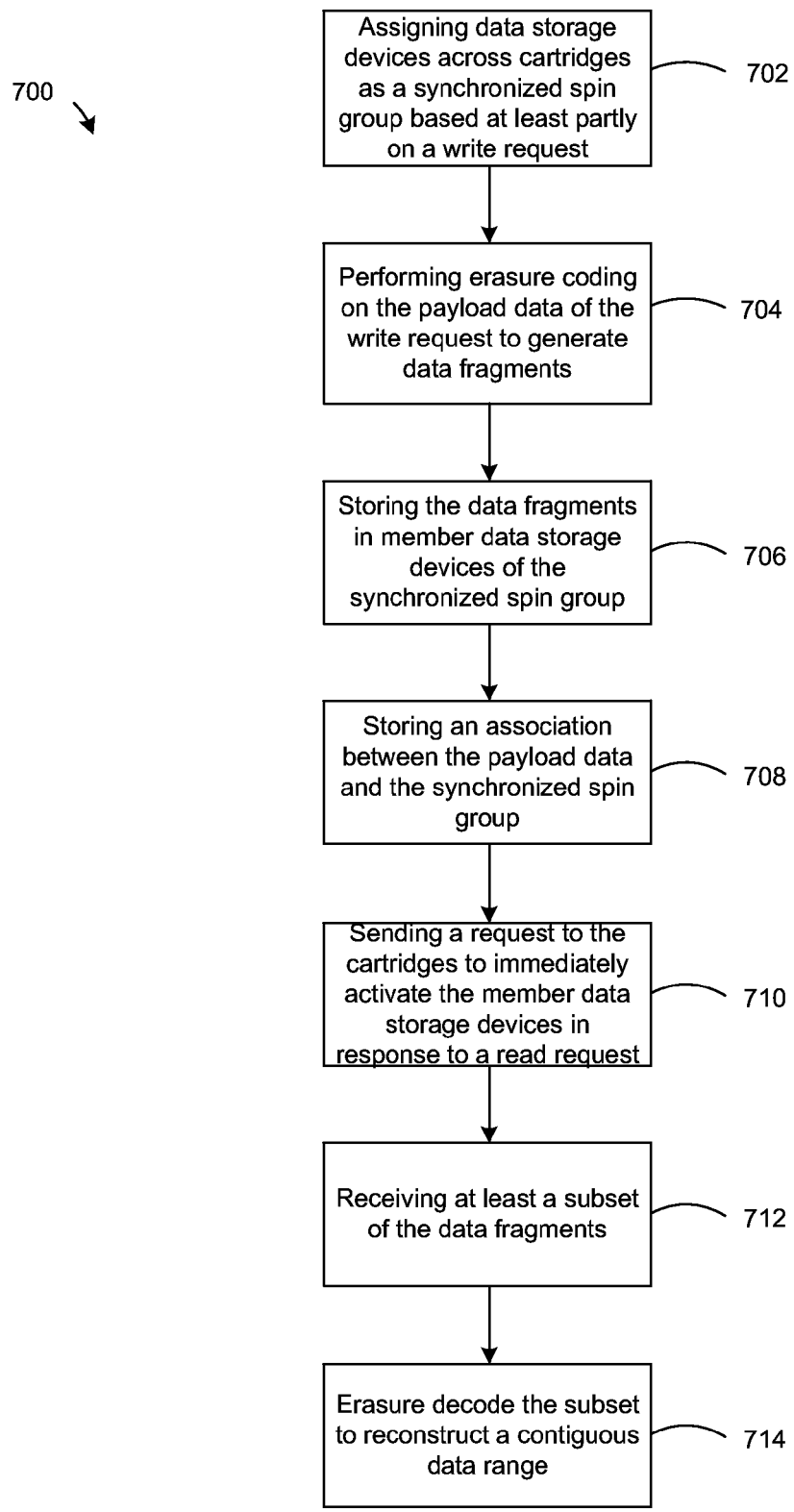
FIG. 7 is a flow chart of a process of synchronized erasure coding across a spin group, consistent with various embodiments.

FIG. 7 is a flow chart of a process 700 of synchronized erasure coding across a spin group, consistent with various embodiments. The process 700 begins with a storage front-end system assigning, at block 702, data storage devices across two or more multiple-data-storage-devices cartridges (e.g., the cartridge 100 of FIG. 1A, the cartridge 200 of FIG. 2, or the multiple-data-storage-devices enclosure 306 of FIG. 3) as a synchronized spin group based at least partly on a write request. In some embodiments, the synchronized spin group here can be used by the storage front-end system as the synchronized spin group discussed in FIG. 6.

The multiple-data-storage-devices cartridges (the "cartridges") are enclosures containing multiple data storage devices, where each enclosure turns on only a subset of its multiple data storage devices at a time. The storage front-end system can be the front-end subsystem 402 of FIG. 4 or the storage front-end system 500 of FIG. 5. The membership of the synchronized spin group can be stored in the front-end subsystem 402. Each cartridge can be independent of one another and thus does not have any knowledge of its data storage devices having memberships in particular synchronized spin groups.

Once assigned together, the cartridges can activate the data storage devices in the synchronized spin group together at the same time. For example, the storage front-end system can send an instruction to the multiple-data-storage-devices cartridges containing the member data storage devices to activate the member data storage devices immediately. The cartridges can also deactivate the data storage devices in the synchronized spin group together.

The membership of the synchronized spin group can follow a numerical pattern. For example, the storage front-end system can assign every first disk drive of a set of cartridges as belonging to a first synchronized spin group, every second disk drive of the set of cartridges as belonging to a second synchronized spin group, and etc. This configuration reduces the complexity requirements of managing the memberships of synchronized spin groups in the storage front-end system.

At block 704, the storage front-end system can perform erasure coding on the payload data of the write request to generate data fragments. Only a subset of the data fragments are needed to reconstruct the data object. Block 704 can be in response to the storage front-end system receiving a client write request. At block 706, the storage front-end system can store the data fragments individually in different member data storage devices of the synchronized spin group. At block 708, the storage front-end system can store an association between the payload data and the synchronized spin group (e.g., by associating a data object identifier of the payload data with a group identifier of the synchronized spin group).

A storage front-end system implementing the process 700 can activate and/or deactivate the synchronized spin group together in response to future read requests. The external management of the membership of the synchronized spin group enables the individual cartridges containing the member data storage devices to remain independent of each other.

For example, at block 710, the storage front-end system can send a request to the cartridges to immediately activate the data storage devices in the synchronized spin group in response to a read request for the data object. Subsequently, the storage front-end system can receive at least a subset of the data fragments from a subset of the synchronized spin group at block 712. Then at block 714, the storage front-end system can erasure decode the subset of data fragments to reconstruct a contiguous data range representing the original payload data/data object.

When the member data storage devices of the synchronized spin groups are hard disks and/or solid-state drives, the synchronized spin groups enable unique access latency characteristics that is advantageous over traditional systems. While waiting for a synchronized spin group to activate, any storage operations to the storage aggregate of the spin group would experience high latency. However, after the synchronized spin group activates, the actual performance of the storage aggregate has low latency. This enables complex storage operations (e.g., deduplication or erasure coding) that span across a large storage capacity to execute under low latency on a low-cost archival storage system.

Some embodiments involve a method of operating a storage front-end system to handle a read request. The method can include: receiving the read request with an object identifier for a data object; identifying a synchronous group of data storage devices across two or more multiple-data-storage-devices enclosures, wherein the synchronous group is associated with the object identifier; sending a request (e.g., a direct, network broadcast or multicast, or fanout message) to the two or more multiple-data-storage-devices enclosures to immediately activate the data storage devices in the synchronous group; retrieving at least a subset of data fragments associated with the object identifier from at least one of the data storage devices; and erasure decoding at least the subset of the data fragments into a contiguous data range to reconstruct the data object. The method can further include retrieving a transformation pipeline associated with the object identifier and transforming the contiguous data range into the data object based at least partly on the transformation pipeline. For example, the transforming the contiguous data range can include decompression, decryption, un-deduplication, or a combination thereof, of the contiguous data range.

The request can be sent to a superset of multiple-data-storage-devices enclosures that includes the two or more multiple-data-storage-devices enclosures. The request can identify at least the synchronous group and the data fragments such that the two or more multiple-data-storage-devices enclosures can recognize that they need to activate their respective data storage devices.

Part of sending the request can include identifying the data storage devices. For example, the data storage devices can be identified by accessing identifiers of the data storage devices associated with the synchronous group for the data object. Subsequently, the storage front-end system can include the identifiers of the data storage devices in the request. As another example, the storage front-end system can access identifiers of the two or more multiple-data-storage-devices enclosures associated with the synchronous group for the data object. The identifiers of the two or more multiple-data-storage-devices enclosures can then be included in the request.

The data storage devices in the synchronous group share a common attribute across the two or more multiple-data-storage-devices enclosures similar to the deduplication group discussed above. The common attribute can be a common enumeration according to the two or more multiple-data-storage-devices enclosures.

The storage front-end system can receive just enough of the data fragments in the subset that are sufficient to erasure decode and reconstruct the contiguous data range. The storage front-end system can determine how many data fragments are sufficient to erasure decode by accessing a transformation recipe associated with the object identifier. For example, a write request comes in, the storage front-end system can select a transformation pipeline that utilizes a specific erasure coding technique. The erasure coding technique can have a reception efficiency associated therewith that governs how portion of the stored data fragments is needed to construct the original payload data of the write request. During the processing of a write request, the storage front-end system can store the reception efficiency information associated with a object identifier in the transformation recipe.

Other embodiments involve a method of operating a storage front-end system to handle a write request. The method can include: receiving the write request including payload data; processing the payload data for storage in response to the write request, wherein the processing includes erasure-coding the payload data or partially processed payload data into data fragments; identifying a synchronous group of data storage devices across two or more multiple-data-storage-devices enclosures; storing the data fragments across the data storage devices of the identified synchronous group; and associating the payload data with a group identifier of the synchronous group. Associating the payload data with the group identifier can include associating an object identifier of the payload data with the group identifier in a data object namespace of the storage front-end system.

The storage front-end system can identify the synchronous group by selecting the two or more multiple-data-storage-devices enclosures from a superset of multiple-data-storage-devices enclosures; and assigning at least a data storage device from each of the two or more multiple-data-storage-devices enclosures as part of the synchronous group. The selection may be based on information regarding the data storage devices in the two or more multiple-data-storage-devices enclosures. For example, the storage file-system can send an inquiry to the superset regarding available storage space and/or failure risk factor of data storage devices in the respective multiple-data-storage-devices enclosures. Selecting of the two or more multiple-data-storage-devices enclosures can be based at least partly on responses to the inquiry from the enclosures. Alternatively, instead of creating a new synchronous group, identifying the synchronous group can include selecting the synchronous group from pre-existing synchronous groups whose identities are stored in the storage front-end system.

In various embodiments, these methods of performing a data retrieval task or a data storage task associated with the synchronous group of the data storage devices can be performed by a computer system serving as a storage front-end system (e.g., the computer device 1200 of FIG. 12).

Figure 8:
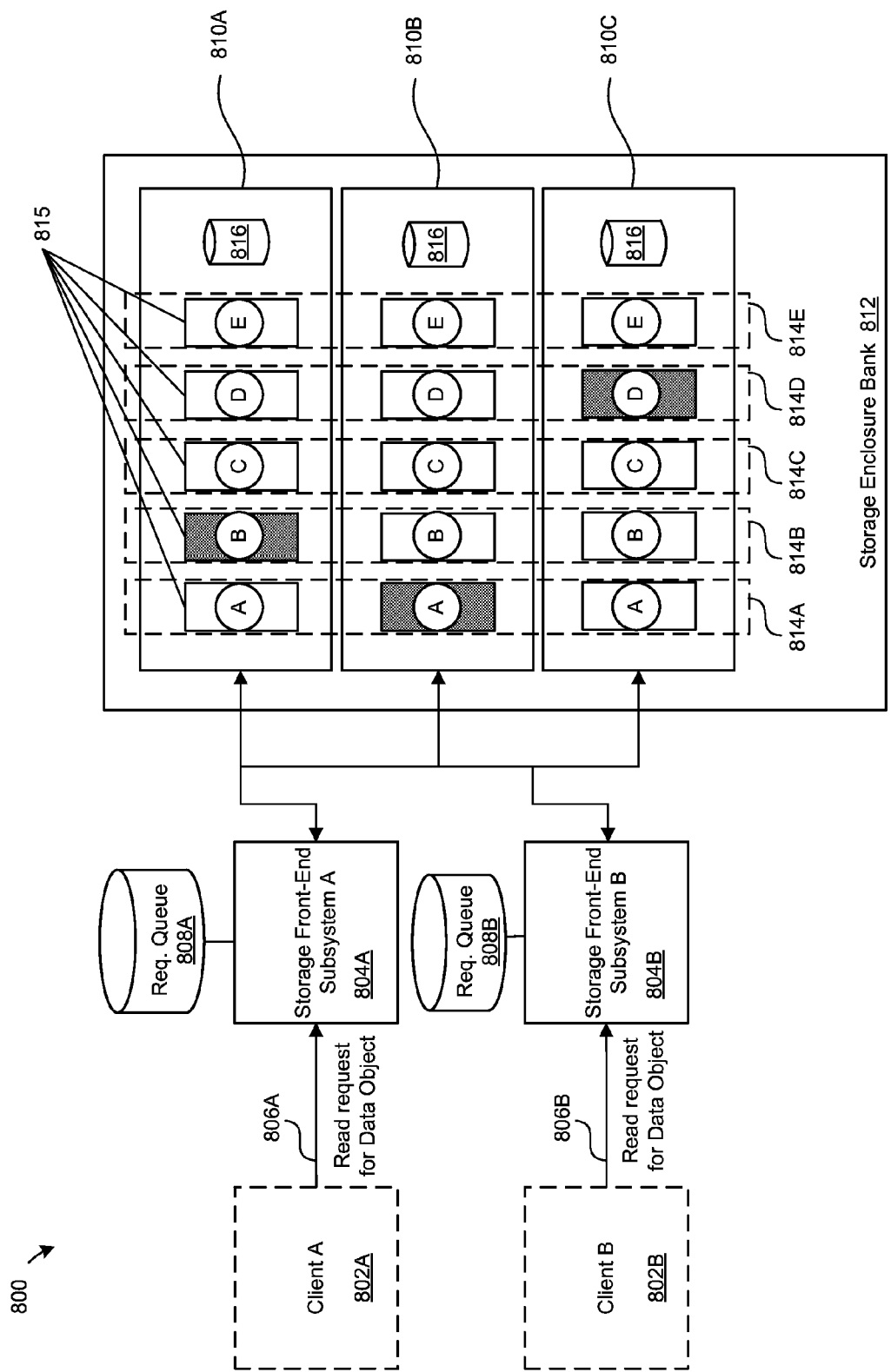
FIG. 8 is a control flow of an archival storage system capable of uncoordinated data access queuing, consistent with various embodiments.

FIG. 8 is a control flow of an archival storage system 800 capable of uncoordinated data access queuing, consistent with various embodiments. The archival storage system 800 can be the archival storage system 300 of FIG. 3 or the archival storage system 400 of FIG. 4. The archival storage system 800 may be accessed by clients (e.g., client 802A and client 802B shown as dashed line boxes, collectively the "clients 802"). The archival storage system 800 includes multiple front-end subsystems (e.g., a front-end subsystem 804A and a front-end subsystem 804B, collectively the "front-end subsystems 804") that process client requests (e.g., a read request 806A and a read request 806B, collectively the "read requests 806"). The front-end subsystems 804 may each include a request queue (e.g., a request queue 808A of the front-end subsystem 804A and a request queue 808B of the front-end subsystem 804B, collectively the "request queues 808").

In the illustrated example, the read requests 806A and the read request 806B target a data object in the archival storage system 800. Each of the clients 802 may be directed to an arbitrary front-end subsystem (e.g., by the client's own choosing or by a network device of the archival storage system 800). For example, the read request 806A can be directed to the front-end subsystem 804A and the read request 806B can be directed to the front-end subsystem 804B. In response to receiving the read requests 806, the front-end subsystem 804A queues the read request 806A in the request queue 808A and the front-end subsystem 804B queues the read request 806B in the request queue 808B.

The front-end subsystems 804 can independently communicate, via direct, broadcast or multicast, or fanout message, its respective read request to two or more multiple-data-storage-devices cartridges (e.g., a cartridge 810A, a cartridge 810B, and a cartridge 810C, collectively the "cartridges 810") in storage enclosure bank 812. The storage enclosure bank 812 can include a number of spin groups (e.g., a spin group 814A, a spin group 814B, a spin group 814C, a spin group 814D, and a spin group 814E, collectively the "spin groups 814"), each having one or more member data storage devices that contain fragments of a user data set. The front-end subsystems can determine and store the memberships of the spin groups 814 when writing user data to the cartridges 810. The read request communicated to the cartridges 810 may also include identifiers of the member data storage devices.

Under the disclosed architecture, the cartridges 810 do not have to activate and/or deactivate the member data storage devices at the same time as each other. For example, the cartridge 810A has a drive "B" activated, the cartridge 810B has a drive "A" activated, and the cartridge 810C has a drive "D" activated. Each cartridge 810 can follow a schedule of activation and deactivation of its data storage devices 815. Each cartridge 810 can optimize the schedule to maximize the lifespan of the data storage devices 815. Optionally, the schedule can be delayed or changed in response to a cartridge receiving a command from one of the front-end subsystems 804 to activate a specific data storage device. Also optionally, when a front-end subsystem establishes a spin group, the front-end subsystem can publish a recommended schedule of activation and/or deactivation to every cartridge that contains a member of that spin group.

For example, the spin group 814A may be represented by disk drives labeled as "A" in each of the cartridges 810. The spin group 812A may contain the data object requested by the read requests 806. Each cartridge that receives the read requests 806 can queue the read requests 806 in its response queue 816. When a member data storage device of the spin group 814A activates on one of the cartridges 810, one or more fragments of the requested data object are sent back to the front-end subsystems 804 (i.e., to satisfy the read requests from the front-end subsystem 804A and the front-end subsystem 804B, respectively).

The front-end subsystems 804 can implement a shared nothing architecture. The disclosed architecture enables uncoordinated retrieval of any data object with fragments stored on data storage devices across any number of storage enclosures (e.g., the cartridges 810). At no point during the process of data object retrieval do the front-end subsystems 804 have to coordinate with each other. This architecture enables scaling the client service throughput without needing to maintain a large database or a global scheduler. This architecture for the archival storage system 800 also enables the client service throughput to scale independently of the storage capacity.

Some embodiments involve a method of operating a multiple-data-storage-devices enclosure (the "enclosure") to perform uncoordinated data retrieval. The method can include: receiving a first read request from a first requester device for a first requested data fragment; identifying a first target data storage device storing the first requested data fragment based at least partly on the first read request; activating, independently of receiving the first read request, only a subset of data storage devices in the enclosure, wherein the subset includes the first target data storage device; retrieving, based at least partly on the first read request and in response to activating the subset, the first requested data fragment from the first target data storage device; and transmitting the first requested data fragment to the first requester device. The first read request can also be directed at other multiple-data-storage-devices enclosures.

The first read request can include a storage device identifier of the first target data storage device. In this case, the enclosure can identify the first target data storage device based on the storage device identifier. Alternatively, the first read request can include a fragment identifier of the first requested data fragment or an object identifier of a data object that originated the first requested data fragment. In this case, the enclosure can identify the first target data storage device based on the fragment identifier or the object identifier and a mapping of the fragment identifier or the object identifier to the first target data storage device. The mapping can be stored in a memory of the enclosure. In yet another alternative embodiment, the first read request includes a group identifier associated with multiple data storage devices across two or more multiple-data-storage-devices enclosures. In this case, the enclosure can identify the first target data storage device based on the group identifier and a mapping of the group identifier to the first target data storage device. Similarly, this mapping can be stored in a memory of the enclosure.

The method described above can also further include storing the first read request in a request queue; and waiting to dequeue the first read request from the request queue to initiate the retrieving of the first data fragment until the first target data storage device is activated. The request queue can store read requests and/or write requests specific for the first target data storage device. In some embodiments, the request queue is dequeued in a first in first out manner. In other embodiments, dequeuing of the request queue is not restricted to the first in first out manner.

The method described above can also process a second read request concurrent to the first read request. For example, the method can further include: receiving the second read request from a second requester device for a second requested data fragment after receiving the first read request; identifying a second target data storage device storing the second requested data fragment based at least partly on the second read request; activating the second target data storage device before, concurrently or after the first target data storage device; retrieving, based at least partly on the second read request and in response to activating the second target data storage device, the second requested data fragment from the second target data storage device; and transmitting the second requested data fragment to the second requester device before, concurrently or after transmitting the first requested data fragment.

Activating the subset can be part of a data storage device activation cycle (e.g., a preset cycle) that rotates through different subsets of the data storage devices in the enclosure. Alternatively, the enclosure can determine an activation schedule and the activating of the subset can be in accordance with the activation schedule. The activation schedule can be determined based at least partly on health statistics of the data storage devices in the enclosure.

Some other embodiments involve a method of operating a storage front-end system to facilitate the uncoordinated data retrieval across the multiple-data-storage-devices enclosures. The method can include: receiving a read request that includes an object identifier for a data object; identifying a device group of data storage devices across two or more multiple-data-storage-devices enclosures, wherein the device group is associated with the object identifier; requesting the data storage devices in the device group to return data fragments associated with the object identifier; asynchronously receiving at least a subset of the data fragments from at least a subset of the data storage devices; and reconstructing the data object from the subset of the data fragments.

Asynchronously receiving at least the subset of the data fragments can include receiving, over a period of time, the subset of the data fragments; and completing at least another storage access operation involving one of the multiple-data-storage-devices enclosures during the period of time. Asynchronously receiving at least the subset of the data fragments can include caching each data fragment of the subset as the data fragment is received such that reconstructing the data object begins when all of the subset of the data fragments have been cached.

The storage front-end system can request the data storage devices to return the data fragments by sending a data retrieval request to a superset of multiple-data-storage-devices enclosures that includes the two or more multiple-data-storage-devices enclosures. The data retrieval request can be a broadcast or a multicast message. The data retrieval request can include a group identifier of the device group, fragment identifiers of the data fragments, or a combination thereof.

In various embodiments, the methods of operating the storage front-end system can be implemented by a computer system, e.g., the computer device 1200 of FIG. 12. In various embodiments, the methods of operating the multiple-data-storage-devices enclosure can be implemented by control circuitry within the enclosure, e.g., the components described within the cartridge 200 of FIG. 2.

Figure 9:
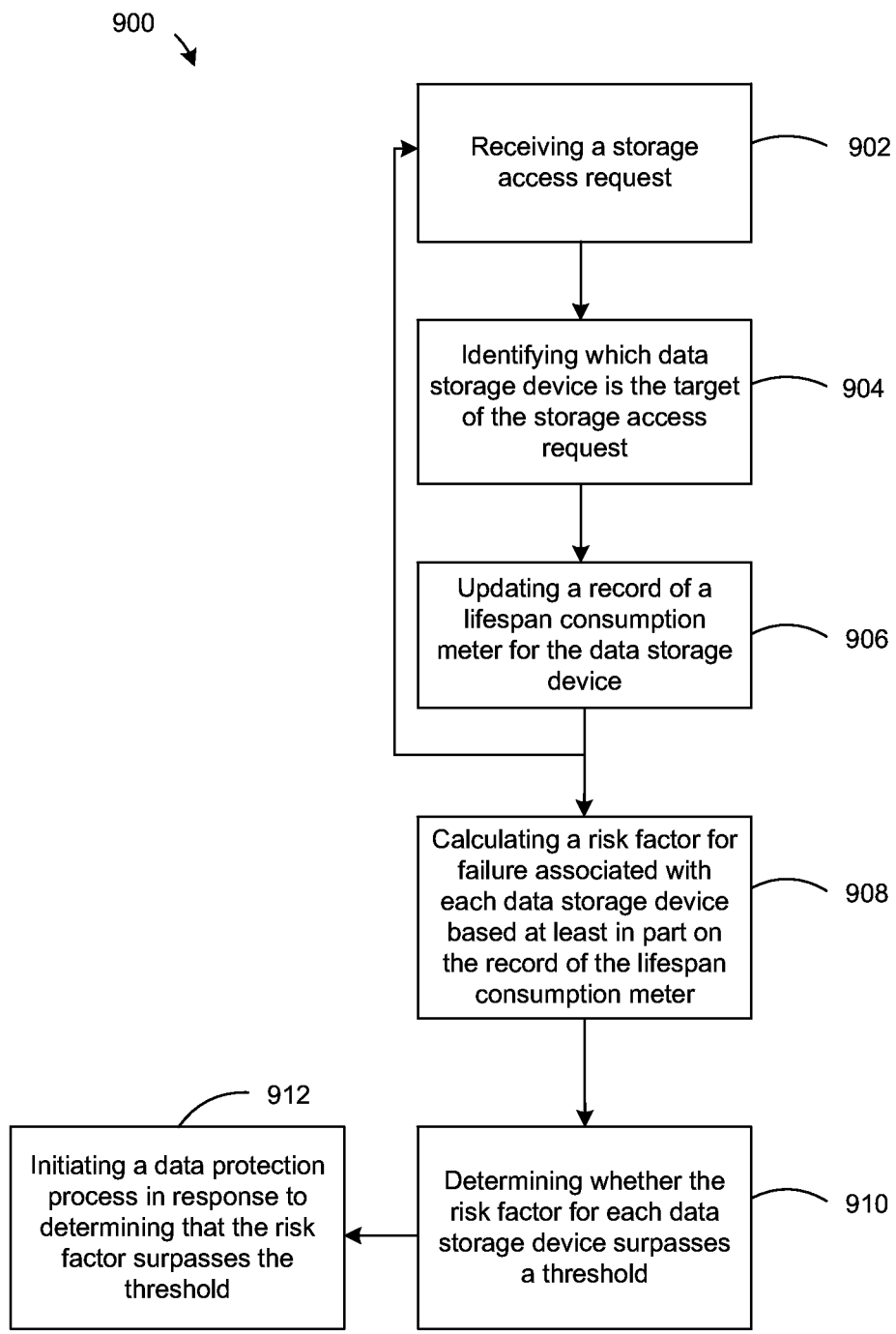
FIG. 9 is a flow chart of a process to monitor lifespan consumption of data storage devices in a multiple-data-storage devices cartridge, consistent with various embodiments.

FIG. 9 is a flow chart of a process 900 to monitor lifespan consumption of data storage devices in a multiple-data-storage devices cartridge ("the cartridge"), consistent with various embodiments. The cartridge can be the cartridge 100 of FIG. 1A, the cartridge 200 of FIG. 2, or the multiple-data-storage-devices enclosure 306 of FIG. 3. The process 900 can be performed on the cartridge itself or via one or more storage front-end systems (e.g., the front-end network manager 310 of FIG. 3, the front-end subsystem 402 of FIG. 4, the storage front-end system 500 of FIG. 5, or the front-end subsystems 804 of FIG. 8). The cartridge can be part of an archival storage system (e.g., the archival storage system 300 of FIG. 3 or the archival storage system 400 of FIG. 4).

The process 900 includes receiving a storage access request (e.g., a read request or a write request) directed at the cartridge at block 902. Then, at block 904, the cartridge identifies which data storage device within the cartridge is the target of the storage access request. At block 906, a lifespan consumption meter of the cartridge updates its record for the identified data storage device. Each lifespan consumption meter can be associated with a single data storage device within the cartridge. The lifespan consumption meter increments its write access count when the storage access request indicates a write operation. The lifespan consumption meter increments its read access count when the storage access request indicates a read operation. The lifespan consumption meter updates its record either in response to the step in block 904 or in response to completion of the storage access operation indicated by the storage access request. The cartridge can maintain a lifespan consumption meter for every data storage device in the cartridge throughout the lifetime of the cartridge or the lifetime of the data storage device.

The lifespan consumption meter may also include a record of how much data is being written (e.g., bytes or bits), how much data is being read (e.g., bytes or bits), how many times the data storage device has been activated (e.g., from a powered-off, spin down, or suspended state), how many times the data storage device has been deactivated (e.g., from a fully functional state), how many hours has the data storage device being running on full power, how much power wattage has the data storage device consumed, etc. The lifespan consumption meter for each of the data storage devices can be queried and/or reported to an administrator of the archival storage system, including the storage front-end system. Blocks 902, 904, and 906 can repeat indefinitely throughout the lifetime of the cartridge, even after one or more of the data storage devices fail.

At block 908, either the cartridge or the storage front-end system calculates a risk factor for failure, the risk factor associated with each data storage device in the cartridge. The risk factor can be based at least in part on the record(s) of the lifespan consumption meter. In some embodiments, the storage front-end system can access the records of the lifespan consumption meter in the cartridge via a data access API service (e.g., the data access API service 220 of FIG. 2) of the cartridge. For example, the risk factor can be calculated as a weighted sum of the counters and records kept by the lifespan consumption meter. Different methods of calculating the risk factor can be used, including the methods and techniques described in U.S. patent application Ser. No. 13/272,806, filed on Oct. 13, 2011.

Then, at block 910, the cartridge or the storage front-end system determines whether the risk factor surpasses a threshold. In response to determining that the risk factor surpasses the threshold, the cartridge or the storage front-end system initiates, at block 912, a data protection process (e.g., migrating, replicating/copying, or other types of backing up data) from the data storage device to another data storage device (the "destination data storage device"). For example, the destination data storage device can be a data storage device with a lower risk factor. The destination data storage device can be a data storage device in another cartridge (e.g., where the cartridge is configured to activate only a single data storage device at a time). Particularly, the destination data storage device can be a data storage device within the same spin group according to the storage front-end system. In various embodiments, an administrator of the archival storage system can configure the threshold, e.g., configuring the threshold specific to the SLO of a particular data set (e.g., to tradeoff between data migration cost and probability of data loss).

The disclosed process proactively migrates data based on visible metrics available to the cartridge and/or the storage front-end system. Because of the proactive migration of data, when a failure occurs, there is a higher probability that no data recovery procedure is necessary to service the needs of the storage system clients.

Some embodiments involve a method of metering lifespan consumption of data storage devices in a multiple-data-storage-devices enclosure. The method can be performed by the enclosure, a storage front-end system in communication with the enclosure, or a combination of both. The method can include: receiving a storage access request; identifying a first data storage device within the enclosure as being targeted by the storage access request, wherein the enclosure includes two or more data storage devices; accessing the first data storage device in response to the storage access request; and in response to the identifying or the accessing, updating a record of a lifespan consumption meter assigned to the first data storage device. The lifespan consumption meter can be maintained through a lifetime of the first data storage device or the enclosure.

The method can also include ways of calculating a risk factor based on the lifespan consumption meter and changing the behavior of a storage system based on the risk factor. For example, either the enclosure or the storage front-end system can determine a risk factor for failure associated with the first data storage device based at least partly on the record of the lifespan consumption meter. The enclosure can report the risk factor associated with the first data storage device to one or more storage front-end systems. Such reporting can be in response to receiving the storage access request from the storage front-end system. Alternatively, the enclosure can transmit the record of the lifespan consumption meter to at least a storage front-end system. The lifespan consumption meter can be maintained through a lifetime of the first data storage device.

Based at least partly on the risk factor, the enclosure or the storage front-end system can modify a schedule to activate or deactivate the first data storage device. Based at least partly on the risk factor, the enclosure or the storage front-end system can also perform a data protection process that involves the first data storage device when the risk factor surpasses a threshold. The data protection process can be a data migration process or a data replication process from the first data storage device to a destination data storage device. To avoid exceeding power limitation in the enclosure, the destination data storage device can be in a different enclosure.

When the storage access request is a write request, updating the record can include incrementing a write access counter that keeps track of how many write accesses have been performed on or targeted toward the first data storage device. When the storage access request is a read request, updating the record can include incrementing a read access counter that keeps track of how many read accesses have been performed on or targeted toward the first data storage device. Updating the record can also include updating a written data size counter based at least partly on how much data is written to or is to be written to the first data storage device in response to the storage access request. Similarly, updating the record can include updating a read data size counter based at least partly on how much data is read from or to be read from the first data storage device in response to the storage access request. The read data size counter and the write data size counter keep track of how much data has been read from or written to the first data storage device.

The lifespan consumption meter can include records related to how many times the first data storage device has been activated and/or deactivated. That is, the enclosure can activate the first data storage device in response to or prior to receiving the storage access request. Updating the record can include incrementing an activation counter of the lifespan consumption meter in response to activating the first data storage device. The enclosure can deactivate the first data storage device after executing the storage access request. Updating the record can include incrementing a deactivation counter of the lifespan consumption meter in response to deactivating the first data storage device.

The lifespan consumption meter can also include records related to a total uptime of the first data storage device. For example, the enclosure can deactivate the first data storage device after a continuous operation of the first data storage device since the activating of the first data storage device. Updating the record can include updating a total uptime counter based at least in part on a time difference between the activating of the first data storage device and the deactivating of the first data storage device.

Other embodiments involve a method of operating a storage front-end system to select which data storage device to write in based on risk factor analysis. For example, the method can include: receiving a write request including payload data; generating a data fragment from the payload data of the write request; determining risk factors associated with data storage devices across two or more multiple-data-storage-devices enclosures; selecting a first data storage device from amongst the data storage devices based at least partly on a first risk factor of the first data storage device; and transmitting the data fragment to a first multiple-data-storage-device enclosure that has the first data storage device for storage.

The storage front-end system can determine the risk factors by receiving the first risk factor associated with the first data storage device from the first multiple-data-storage-devices enclosure. That is, the first multiple-data-storage-devices enclosure can calculate the first risk factor of its own data storage devices. Alternatively, the storage front-end system can receive a failure risk-related record associated with the first data storage device and determine the first risk factor based at least partly on the record. The failure risk-related record can be a record of a lifetime consumption meter. The lifetime consumption meter can include records of a storage access frequency, a storage access count, a data throughput amount, a total uptime, or any combination thereof, of the first data storage device. The failure risk-related record can be a record of a fault sensor. The fault sensor can monitor performance of the first data storage device (e.g., a write access latency, a read access latency, a storage activation latency, or any combination thereof).

The storage front-end system can select the first data storage device based at least partly on the first risk factor as compared to other risk factors associated with the data storage devices. Alternatively, the storage front-end system can select the first data storage device based at least partly on the first risk factor as compared to a threshold.

In various embodiments, the methods of operating the storage front-end system can be implemented by a computer system, e.g., the computer device 1200 of FIG. 12. In various embodiments, the methods of operating the multiple-data-storage-devices enclosure can be implemented by control circuitry within the enclosure, e.g., the components described within the cartridge 200 of FIG. 2.

Figure 10:
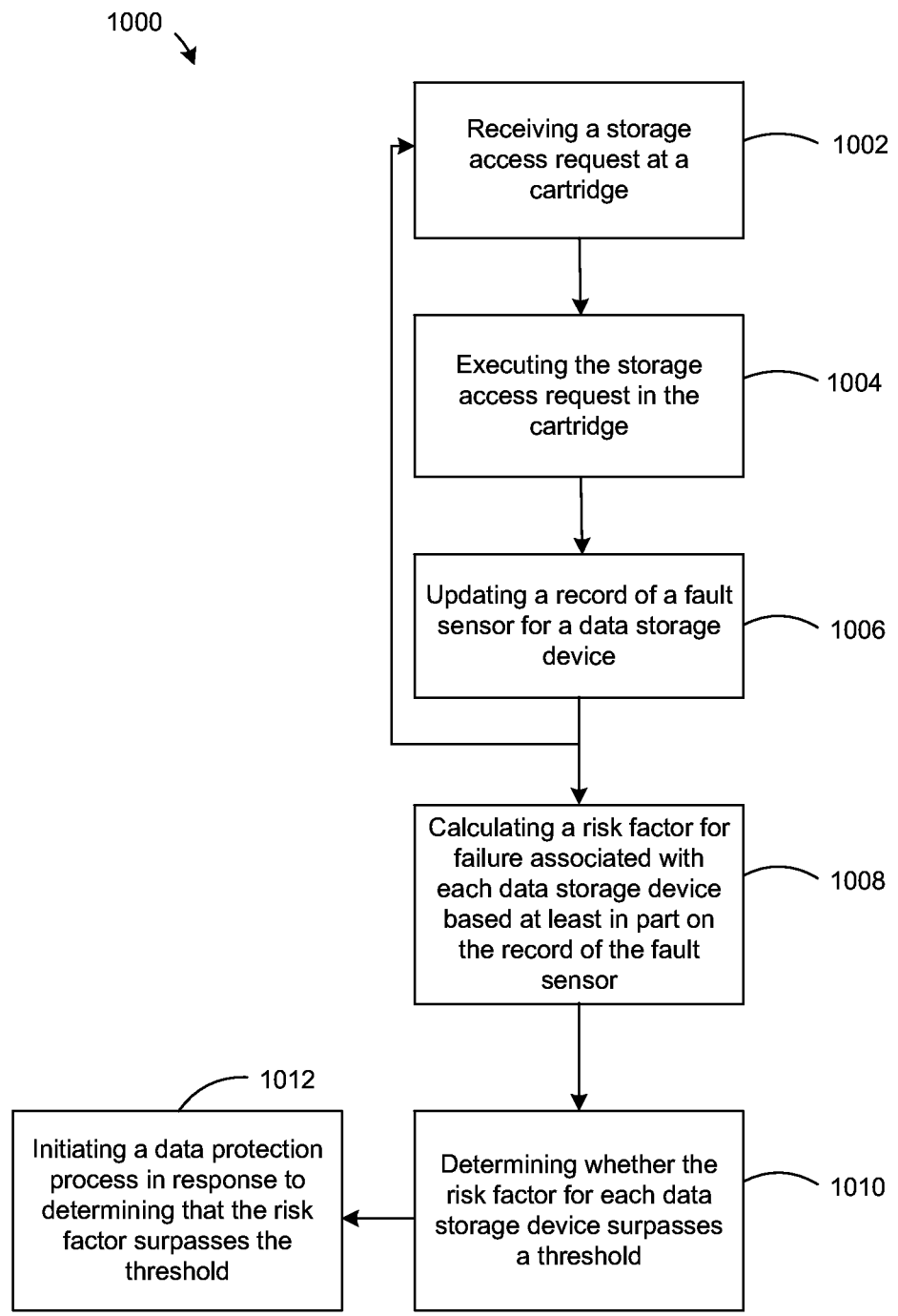
FIG. 10 is a flow chart of a process for predictive fault sensing of data storage devices in a multiple-data-storage devices cartridge, consistent with various embodiments.

FIG. 10 is a flow chart of a process 1000 for predictive fault sensing of data storage devices in a multiple-data-storage devices cartridge ("the cartridge"), consistent with various embodiments. The cartridges can be the cartridge 100 of FIG. 1A, the cartridge 200 of FIG. 2, or the multiple-data-storage-devices enclosure 306 of FIG. 3. The process 900 can be performed on the cartridge itself or via one or more storage front-end systems (e.g., the front-end network manager 310 of FIG. 3, the front-end subsystem 402 of FIG. 4, the storage front-end system 500 of FIG. 5, or the front-end subsystems 804 of FIG. 8). The cartridge can be part of an archival storage system (e.g., the archival storage system 300 of FIG. 3 or the archival storage system 400 of FIG. 4).

The process 1000 includes receiving a storage access request (e.g., a write request or a read request) directed at the cartridge at block 1002. Then, at block 1004, the cartridge executes the storage access request. At block 1006, a fault sensor of the cartridge updates its record for the data storage device in regards to the execution of the storage access request.

Each fault sensor can be associated with a single data storage device within the cartridge. The fault sensor measures how long it takes for the data storage device to activate (e.g., to spin up), a read operation latency, a write operation latency, or any combination thereof. The fault sensor can update its record in response to the step in block 1004. The cartridge can maintain a fault sensor for every data storage device in the cartridge throughout the lifetime of the cartridge. The fault sensor for each of the data storage device can be queried and/or reported to an administrator of the archival storage system including the storage front-end system. Blocks 1002, 1004, and 1006 can repeat indefinitely throughout the lifetime of the cartridge, even after one or more of the data storage devices fail.

At block 1008, either the cartridge or the storage front-end system calculates a risk factor for failure, the risk factor associated with each data storage device in the cartridge. The risk factor can be calculated based at least in part on the record(s) of the fault sensor for the data storage device. In some embodiments, the storage front-end system can access the records of the fault sensor via a data access API service (e.g., the data access API service 220 of FIG. 2) of the cartridge. For example, the risk factor can be calculated as a weighted sum of the counters and records kept by the fault. Different methods of calculating the risk factor of failure can be used similar to the process 900 of FIG. 9.

Then, at block 1010, the cartridge or the storage front-end system determines whether the risk factor surpasses a threshold. In response to determining that the risk factor surpasses the threshold, the cartridge or the storage front-end system initiates, at block 1012, a data protection process (e.g., migrating, replicating/copying, or other types of backing up data) from the data storage device to another data storage device (the "destination data storage device"). For example, the destination data storage device can be a data storage device with a lower risk factor. The destination data storage device can be a data storage device in another cartridge (e.g., where the cartridge is configured to activate only a single data storage device at a time). Particularly, the destination data storage device can be a data storage device within the same spin group according to the storage front-end system. In various embodiments, an administrator of the archival storage system can configure the threshold, e.g., configuring the threshold specific to the SLO of a particular data set in terms of the tradeoff between data migration cost and probability of data loss.

Furthermore, the storage front-end system can actively select healthy data storage devices when writing data to the cartridge. This is accomplished by querying the cartridge for the risk factors of its data storage devices (e.g., through the process 900 or the process 1000) in response to a write request, and selecting a data storage device based at least partly on the risk factors (e.g., selecting the data storage device with the lowest risk factor rating or selecting the data storage device that is below a threshold risk factor).

Some embodiments involve a method of fault monitoring data storage devices in a multiple-data-storage-devices enclosure. The method can be performed by the enclosure, a storage front-end system in communication with the enclosure, or a combination of both. The method can include: receiving a storage access request; identifying a first data storage device as being targeted by the storage access request, wherein the enclosure includes two or more data storage devices including the first data storage device; performing an access operation according to the storage access request on the first data storage device; and updating a record of a fault sensor assigned to the first data storage device by monitoring the performing of the access operation.

The method can also include ways of calculating a risk factor based on records of the fault sensor and changing the behavior of a storage system based on the risk factor. The risk factor can be calculated and used in a similar fashion as described in this disclosure for the methods of metering lifespan consumption of data storage devices. In various embodiments, the records of the fault sensor or the lifespan consumption meter can be used together or separately to calculated the risk factor of a data storage device.

When the access operation is a write operation, updating the record can include updating a write latency of the write operation on the first data storage device. When the access operation is a read operation, updating the record can include updating a read latency of the read operation. In various embodiments, the enclosure can activate the first data storage device before performing the access operation. After activating the first data storage device, the enclosure can update the record of a lag time (i.e., activation latency) for the enclosure to access the first data storage device after power is supplied to the first data storage device. The record can include a moving average of its entries (e.g., the write latency, the read latency, or the activation latency) and/or a list of the latest measurements.

Other embodiments involve a method of a method of responding to a potential impending failure of a data storage device in a multiple-data-storage-devices enclosure. The method can be performed by the enclosure or a storage front-end system in communication with the enclosure. For example, the method can include: determining a first risk factor of the data storage device; determining whether the first risk factor surpasses a threshold; selecting a destination data storage device from amongst data storage devices across two or more multiple-data-storage-devices enclosures; and initiating a data protection process to copy data from the data storage device to the destination data storage device.

The enclosure or the storage front-end system can determine the first risk factor based at least partly on performance monitoring of the data storage device (e.g., by maintaining a record of write access latency, read access latency, activation latency, or any combination thereof, of the data storage device), metering operations to the data storage device (e.g., maintaining a record of a storage access frequency, a storage access count, a data throughput amount, a total uptime, or any combination thereof, of the data storage device), or a combination thereof. Alternatively, the storage front-end system can determine the first risk factor by receiving the first risk factor associated with the data storage device from the multiple-data-storage-devices enclosure that includes the data storage device.

The enclosure or the storage front-end system can select the destination data storage device by: selecting the destination data storage device having a second risk factor that indicates a lower chance of failure than the first risk factor; selecting the destination data storage device having a second risk factor that does not surpass the threshold; selecting the destination data storage device based at least partly on a ranking of risk factors of the data storage devices and/or selecting the destination data storage device that is part of a same synchronous group of data storage devices as the data storage device. The storage front-end system can be configured to activate and/or deactivate members of the synchronous group together. The storage front-end system can also be configured to associate object identifiers of data objects maintained by the storage front-end system with specific synchronous groups.

In various embodiments, the methods of operating the storage front-end system can be implemented by a computer system, e.g., the computer device 1200 of FIG. 12. In various embodiments, the methods of operating the multiple-data-storage-devices enclosure can be implemented by control circuitry within the enclosure, e.g., the components described within the cartridge 200 of FIG. 2.

Figure 11:
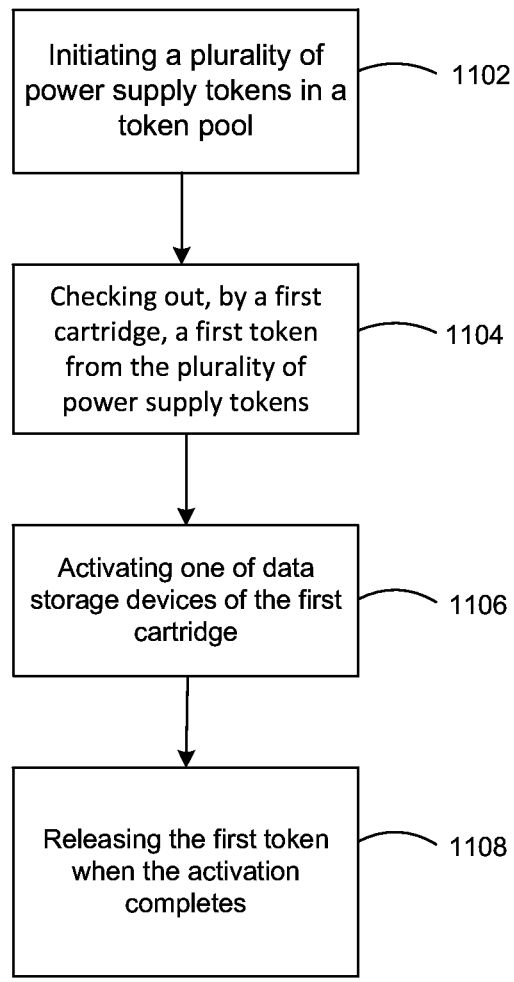
FIG. 11 is a flow chart of a process of token-based cascade staging of multiple-data-storage devices cartridges, consistent with various embodiments.

FIG. 11 is a flow chart of a process 1100 of token-based cascade staging of multiple-data-storage devices cartridges (the "cartridges"), consistent with various embodiments. The cartridges can each be the cartridge 100 of FIG. 1A, the cartridge 200 of FIG. 2, or the multiple-data-storage-devices enclosure 306 of FIG. 3. The cartridges can be part of a storage rack (e.g., the rack 150). The cartridges can share a power supply with an upper limit of how much power it can supply. Each cartridge in the storage rack can be allocated at least a fixed power usage. The process 1100 can be used to allocate additional power to the cartridges when powering up a data storage device within the cartridge or when an operation occurs that results in a power spike is about to happen.

The process 1100 begins at block 1102 by initiating multiple power supply tokens in a token pool (e.g., implemented by a token buffer in memory). The power supply tokens can retain a checked-out state or a released state. A power supply token in the checked-out state cannot be checked out again. Only a power supply token in the released state can be checked out. At block 1104, a first cartridge checks out a first token from the multiple power supply tokens. The first token can specifically indicate how much power is allocated along with it. Alternatively, the first token indicates that the first cartridge can activate one of its data storage devices. The checking out and in of the first token can be performed by first finding an available first token by sending a broadcast request, then using a two-phase commit protocol (2PC) to transfer the first token from the source. For example, the token pool can be maintained by one of the cartridges, be spread across all of the cartridges within a given power supply domain, or maintained by an external computer system in communication with the cartridges.

Subsequently, the first cartridge activates one of its data storage devices in block 1106. When the activation completes and a power consumption level of the first cartridge stabilizes to a steady-state, the first cartridge releases, at block 1108, the first token back to the token pool as being available.

The disclosed process enables the storage rack to better manage power supplied to the cartridges therein. Specifically, because power spikes are associated with activation of data storage devices within the cartridges, the power supply tokens can limit the amount of data storage device activations at any given time. It also reduces vibration by limiting the number of concurrent storage device activations.

Some embodiments involve a method of managing power for a first multiple-data-storage-devices enclosure. The method can include: checking out a first token over a network connection from a token pool shared by multiple-data-storage-devices enclosures including the first enclosure, wherein each token of the token pool is available to be checked out by a single device and wherein the enclosures share power drawn from a common power supply; after or in response to checking out the first token, initiating activation of a data storage device within the first enclosure; monitoring power consumption within the first enclosure; and releasing the first token back to the token pool when the power consumption in the first enclosure substantially reaches a steady-state after the activation of the data storage device is initiated. The first enclosure can be coupled to the power supply via the network connection.

The activation of the data storage device can include supplying power in stages to multiple components in the first enclosure for a processor of the first enclosure to establish access to the data storage device. The first enclosure can release the first token when all the stages are completed. The activation of the data storage device can also include providing, by a processor in the first enclosure, access to the data storage device to a filesystem implemented by the processor. The first enclosure can release the first token when data in the data storage device is made accessible to the filesystem.

The method can further include determining that additional power is needed beyond a power allotment granted by the first token and checking out a second token over the network connection from the token pool while the first token is still checked out. The first enclosure can check out the first token by sending a broadcast message through the network connection to others of the enclosures. The first enclosure can check out the first token by sending a message through the network connection to a known device that manages the token pool (e.g., another one of the enclosures).

Other embodiments involve a method of managing power for multiple-data-storage-devices enclosures ("the enclosures") sharing a power supply. The method can include: maintaining a token pool shared by the enclosures, the token pool having multiple power supply tokens each available to be checked out by a single device; receiving a checkout request over a network connection from a first enclosure of the enclosures; and in response to receiving the checkout request, checking out a first token from the token pool to the first enclosure, wherein the first token represents a unit of power under which the first enclosure is allowed to draw from the power supply. The method can further include: receiving a release request from the first enclosure and, in response to receiving the release request, releasing the first token into the token pool. The method can be performed by a token pool manager (e.g., one of the enclosures or a computer system in communication with the enclosures).

The token pool manager can initiate the multiple power supply tokens into the token pool to be available to the enclosures. The token pool manager can synchronize the token pool with a mirror token pool over the network connection with another token pool manager.

The token pool manager can monitor power consumption drawn from the power supply. Based at least partly on the monitoring, the token pool manager can add or remove at least one token from the token pool. The token pool manager can prevent a device that has not checked out one of the multiple power supply tokens from drawing power from the power supply (e.g., by power gating).

The multiple power supply tokens can each represent an identical unit of power under which a device that checks out the each power supply token is allowed to draw from the power supply. Optionally, the multiple power supply tokens can have at least two different subsets representing different units of power under which a device that checks out a token from the each subset is allowed to draw from the power supply.

In various embodiments, the methods of operating the multiple-data-storage-devices enclosure can be implemented by control circuitry within the enclosure, e.g., the components described within the cartridge 200 of FIG. 2.

While processes or blocks are presented in a given order in FIGS. 4-11, alternative embodiments may perform routines having steps, or employ systems having blocks, in a different order, and some processes or blocks may be deleted, moved, added, subdivided, combined, and/or modified to provide alternative or subcombinations. Each of these processes or blocks may be implemented in a variety of different ways. In addition, while processes or blocks are at times shown as being performed in series, these processes or blocks may instead be performed in parallel, or may be performed at different times.

It is understood that the use of relational terms, if any, such as first and second, and the like are used solely for distinguishing one entity or action from another, without necessarily requiring or implying any such actual relationship or order between such entities or actions.

FIG. 12 is a block diagram illustrating a diagrammatic representation of a computing device 1200 within which a set of instructions, for causing the machine to perform any one or more of the methodologies or modules discussed herein, may be executed. For example, the computing device 1200 can be part of the cartridge 100 of FIG. 1A, the cartridge 200 of FIG. 2, the data range processor module 302 or the front-end network manager 310 of FIG. 3, the front-end subsystem 402 or one of the storage subsystems 404 of FIG. 4, the storage front-end system 500 of FIG. 5, one of the clients 802, the front-end subsystems 804 or the cartridges 810 of FIG. 8, or any combination thereof, In alternative embodiments, the machine may comprise or include a network router, a network switch, a network bridge, personal digital assistant (PDA), a cellular telephone, a Web appliance or any machine capable of executing or transmitting a sequence of instructions that specify actions to be taken. The computing device 1200 is intended to illustrate a hardware device on which any of the instructions, processes, modules and components depicted in the figures above (and any other processes, techniques, modules and/or components described in this specification) can be implemented. As shown, the computing device 1200 includes a processor 1202, memory 1204, non-volatile memory 1206, and a network interface 1208. Various common components (e.g., cache memory) are omitted for illustrative simplicity. The computing device 1200 can be of any applicable known or convenient type, e.g., a personal computer (PC), server-class computer or mobile device (e.g., smartphone, card reader, tablet computer, etc.). The components of the computing device 1200 can be coupled together via a bus and/or through any other known or convenient form of interconnect.

One of ordinary skill in the relevant art will recognize that the terms "machine-readable (storage) medium" or "computer-readable (storage) medium" include any type of device that is accessible by the processor 1202. The memory 1204 is coupled to the processor 1202 by, for example, a bus 1210. The memory 1204 can include, by way of example but not limitation, random access memory (RAM), e.g., dynamic RAM (DRAM) and static RAM (SRAM). The memory 1204 can be local, remote, or distributed.

The bus 1210 also couples the processor 1202 to the non-volatile memory 1206 and drive unit 1212. The non-volatile memory 1206 may be a hard disk, a magnetic-optical disk, an optical disk, a read-only memory (ROM), e.g., a CD-ROM, Erasable Programmable Read-Only Memory (EPROM), or Electrically Erasable Programmable Read-Only Memory (EEPROM), a magnetic or optical card, or another form of storage for large amounts of data. The non-volatile memory 1206 can be local, remote, or distributed.

The data structures, modules, and instruction steps described in the figures above may be stored in the non-volatile memory 1206, the drive unit 1212, or the memory 1204. The processor 1202 may execute one or more of the modules stored in the memory components.

The bus 1210 also couples the processor 1202 to the network interface 1208. The network interface 1208 can include one or more of a modem or network interface. A modem or network interface can be considered to be part of the computing device 1200. The network interface 1208 can include an analog modem, ISDN modem, cable modem, token ring interface, satellite transmission interface (e.g., "direct PC"), or other interfaces for coupling a computer system to other computer systems.

It is to be understood that embodiments may be used as or to support software programs or software modules executed upon some form of processing core (e.g., the CPU of a computer) or otherwise implemented or realized upon or within a machine or computer-readable medium. A machine-readable medium includes any mechanism for storing or transmitting information in a form readable by a machine, e.g., a computer. For example, a machine-readable medium includes read-only memory (ROM); random access memory (RAM); magnetic disk storage media; optical storage media; flash memory devices; electrical, optical, acoustical or other form of propagated signals, for example, carrier waves, infrared signals, digital signals, etc.; or any other type of media suitable for storing or transmitting information.

This disclosure includes other aspects, elements, features, and steps in addition to or in place of what is described in the figures. These potential additions and replacements are described throughout the specification. For example, some embodiments involve a method of writing data through a data range application programming interface ("API") implemented on a multiple-data-storage-devices cartridge (the "cartridge"). The method includes receiving a write request from a requester device, wherein the write request is a direct, broadcast or multicast, or fanout message and includes a size indication for a contiguous range of data; responsive to receiving the write request, sending a response message to the requester device indicating an intent to store the contiguous range of data; receiving the contiguous range of data from the requester device; powering on a target data storage device from amongst data storage devices within the cartridge while keeping at least another data storage device in the cartridge powered down; and writing the contiguous range of data to the target data storage device.

In response to receiving the write request, the cartridge can select the target data storage device from amongst the data storage devices within the cartridge. The cartridge can send the response message with a storage device identifier of the target data storage device to the requester device. The cartridge can power on the target data storage device in response to sending the response message. That is, unless the target data storage device is already powered on.

The write request can indicate that the target data storage device is selected by the requester device to store the contiguous range of data. The requester device can be a storage front-end system or a client device. Powering on the target data storage device can be responsive to receiving the write request that indicates the target data storage device. That is, unless the target data storage device is already powered on. The cartridge can send failure risk factors for each of the data storage devices within the cartridge to the requester device as part of the response message. The cartridge can also specifically send a failure risk factor for the target data storage device to the requester device as part of the response message when the target data storage device is already identified by the write request.

The cartridge can write the contiguous range of data by writing to the target data storage device sequentially without returning to a previously written memory section in the target data storage device while the target data storage device has been continuously powered on. The cartridge can write the contiguous range of data without modifying data already written in the target data storage device.

Some embodiments involve a method of reading data through a data range API implemented on a multiple-data-storage-devices cartridge. The method of reading data can include: receiving a read request from a requester device, wherein the read request is a direct, broadcast or multicast, or fanout message and includes a data range identifier associated with a contiguous range of data; responsive to receiving the read request, determining whether the contiguous range of data is found in the cartridge and which target data storage device from amongst data storage devices within the cartridge contains the contiguous range of data; powering on the target data storage while keeping at least another data storage device in the cartridge powered down; retrieving the contiguous range of data from the target data storage device; and sending the contiguous range of data to the requester device.

The data range identifier can include a spin group identifier associated with member data storage devices across different cartridges including the cartridge that received the read request. The contiguous range of data is a data fragment associated with other data fragments in other member data storage devices across the different cartridges. The read request may include a group identifier of a spin group such that the cartridge can determine whether the contiguous range of data is found in the cartridge by determining whether one of the data storage devices within the cartridge is in the spin group. The cartridge can also determine which target data storage device contains the contiguous range of data by determining which target data storage device is in the spin group.

Some other embodiments involve a multiple-data-storage-devices cartridge. The cartridge can include: two or more data storage devices; a data communication port to receive a data connection to a computer network and to receive and supply power to the multiple-data-storage-devices cartridge; a power management circuitry for managing power supplied from the data communication port to one or more of the data storage devices; and control circuitry comprising memory storing executable instructions and a computing component. The computing component can be configured by the executable instructions to execute any of the methods for reading and writing data described above.

What is claimed is:

1. A method of operating a storage system, comprising:
   receiving a read request with an object identifier for a data object;
   identifying a synchronous group of data storage devices across a plurality of enclosures, wherein the synchronous group of data storage devices is associated with the object identifier, wherein each of the plurality of enclosures comprises a plurality of data storage devices;
   sending a request to the plurality of enclosures to synchronously activate the data storage devices in the synchronous group of data storage devices;
   retrieving metadata based, at least in part, on the object identifier;
   after sending the request to the plurality of enclosures, retrieving data fragments associated with the object identifier from the synchronous group of data storage devices;
   determining, from the retrieved metadata, a first set of operations and an order of the first set of operations, wherein the first set of operations were performed on the data object in the order, wherein the first set of operations comprise at least two of compression, encryption, deduplication, or erasure coding; and
   performing on the data fragments a second set of operations corresponding to the first set of operations in reverse of the order to reconstruct the data object.

2. The method of claim 1, wherein sending the request comprises sending the request to a superset of enclosures that includes the plurality of enclosures, wherein the request identifies at least the synchronous group of data storage devices and the data fragments.

3. The method of claim 1, further comprising:
   determining identifiers of the synchronous group of data storage devices, wherein the request comprises the identifiers of the data storage devices.

4. The method of claim 1, further comprising:
   determining identifiers of the plurality of enclosures, wherein the request comprises the identifiers of the plurality of enclosures.

5. The method of claim 1, wherein the synchronous group of data storage devices share a common attribute across the plurality of enclosures.

6. The method of claim 5, wherein the common attribute is a position of each of the synchronous group of data storage devices within a respective enclosure of the plurality of enclosures.

7. The method of claim 1, wherein a number of the data fragments retrieved from the synchronous group of data storage devices is sufficient to erasure decode and reconstruct the data object.

8. The method of claim 1, further comprising:
   determining a reception efficiency stored in the metadata, wherein retrieving the data fragments is based, at least in part, on the reception efficiency.

9. A non-transitory computer-readable storage memory having executable instructions stored thereon, the executable instructions to:
   receive a read request with an object identifier for a data object;
   identify a first synchronous group of data storage devices across a first plurality of enclosures, wherein the first synchronous group of data storage devices is associated with the object identifier, wherein each of the first plurality of enclosures comprises a plurality of data storage devices;
   send a request to the first plurality of enclosures to synchronously activate the data storage devices in the first synchronous group of data storage devices; and
   retrieve metadata based, at least in part, on the object identifier;
   after sending the request to the first plurality of enclosures, retrieve first data fragments associated with the object identifier from the first synchronous group of data storage devices;
   determine, from the retrieved metadata, a first set of operations and an order of the first set of operations, wherein the first set of operations were performed on the data object in the order, wherein the first set of operations comprise at least two of compression, encryption, deduplication, or erasure coding; and perform on the first data fragments a second set of operations corresponding to the first set of operations in reverse of the order to reconstruct the data object.

10. The non-transitory computer-readable storage memory of claim 9, wherein a number of the data fragments retrieved from the synchronous group of data storage devices are sufficient to erasure decode and reconstruct the data object.

11. The non-transitory computer-readable storage memory of claim 9, wherein the executable instructions further comprise executable instructions to:

determine a reception efficiency stored in the metadata, wherein the executable instructions to retrieve the data fragments is based, at least in part, on the reception efficiency.

12. The non-transitory computer-readable storage memory of claim 9, wherein the executable instructions further comprise executable instructions to:

receive a write request including payload data;

perform the first set of operations on the payload data to transform the payload data into second data fragments;

identify a second synchronous group of data storage devices across a second plurality of enclosures;

store the second data fragments across the data storage devices of the second synchronous group of data storage devices; and associate the payload data with a group identifier of the second synchronous group of data storage devices.

13. The non-transitory computer-readable storage memory of claim 9, wherein the executable instructions to send the request comprises executable instructions to send the request to a superset of enclosures that includes the first plurality of enclosures, wherein the request identifies at least the synchronous group of data storage devices and the first data fragments.

14. The non-transitory computer-readable storage memory of claim 9, wherein the executable instructions further comprises executable instructions to determine identifiers of the synchronous group of data storage devices, wherein the request comprises the identifiers of the synchronous group of data storage devices.

15. An apparatus comprising:

a hardware processor; and a computer-readable storage medium having instructions embodied therewith, the instructions comprising program code which, when executed by the processor, cause the apparatus to:

receive a read request with an object identifier for a data object;

identify a synchronous group of data storage devices across a plurality of enclosures, wherein the synchronous group of data storage devices is associated with the object identifier, wherein each of the plurality of enclosures comprises a plurality of data storage devices;

send a request to the plurality of enclosures to synchronously activate the data storage devices in the synchronous group of data storage devices;

retrieve metadata based, at least in part, on the object identifier;

after sending the request to the plurality of enclosures, retrieve data fragments associated with the object identifier from the synchronous group of data storage devices;

determine, from the retrieved metadata, a first set of operations and an order of the first set of operations, wherein the first set of operations were performed on the data object in the order, wherein the first set of operations comprise at least two of compression, encryption, deduplication, or erasure coding; and perform on the data fragments a second set of operations corresponding to the first set of operations in reverse of the order to reconstruct the data object.

16. The apparatus of claim 15, wherein the instructions further comprise instructions which, when executed by the processor, cause the apparatus to:

determine a reception efficiency stored in the metadata, wherein instructions to retrieve the data fragments are based, at least in part, on the reception efficiency.

17. The apparatus of claim 15, wherein a number of the data fragments retrieved from the synchronous group of data storage devices are sufficient to erasure decode and reconstruct the data object.

18. The apparatus of claim 15, wherein the instructions to send the request comprise instructions which, when executed by the processor, cause the apparatus to send the request to a superset of enclosures that includes the plurality of enclosures, wherein the request identifies at least the synchronous group of data storage devices and the data fragments.

19. The apparatus of claim 15, wherein the instructions further comprise instructions which, when executed by the processor, cause the apparatus to determine identifiers of the synchronous group of data storage devices, wherein the request comprises the identifiers of the synchronous group of data storage devices.

* * * * *